(12) United States Patent
Barlaz et al.

(10) Patent No.: US 12,543,517 B2
(45) Date of Patent: Feb. 3, 2026

(54) SYSTEM AND METHOD FOR SEMICONDUCTOR STRUCTURE

(71) Applicant: Tokyo Electron Limited, Tokyo (JP)

(72) Inventors: David Eitan Barlaz, Albany, NY (US); Angelique Raley, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 315 days.

(21) Appl. No.: 18/314,885

(22) Filed: May 10, 2023

(65) Prior Publication Data

US 2024/0379354 A1    Nov. 14, 2024

(51) Int. Cl.
| | |
|---|---|
| *H01L 23/00* | (2006.01) |
| *H01J 37/32* | (2006.01) |
| *H01L 21/02* | (2006.01) |
| *H01L 21/027* | (2006.01) |
| *H01L 21/268* | (2006.01) |
| *H01L 21/3065* | (2006.01) |

(52) U.S. Cl.
CPC .. *H01L 21/02636* (2013.01); *H01J 37/32339* (2013.01); *H01J 37/32715* (2013.01); *H01L 21/268* (2013.01); *H01L 21/3065* (2013.01)

(58) Field of Classification Search
None
See application file for complete search history.

(56) References Cited

U.S. PATENT DOCUMENTS

| | | |
|---|---|---|
| 4,938,996 A | 7/1990 | Ziv et al. |
| 5,877,045 A | 3/1999 | Kapoor |
| 9,171,733 B2 | 10/2015 | Ruzic et al. |
| 10,147,655 B2 | 12/2018 | deVilliers |
| 10,510,550 B2 | 12/2019 | Peck et al. |
| 10,998,244 B2 | 5/2021 | deVilliers |
| 11,302,588 B2 | 4/2022 | Clark et al. |
| 2005/0078462 A1 | 4/2005 | Dando et al. |
| 2018/0286643 A1 | 10/2018 | Tuitje et al. |
| 2019/0198338 A1 | 6/2019 | Kim et al. |
| 2019/0198467 A1* | 6/2019 | Tanaka ............... H01L 21/0274 |
| 2021/0183656 A1 | 6/2021 | Lutker-Lee et al. |

(Continued)

FOREIGN PATENT DOCUMENTS

| | | |
|---|---|---|
| CN | 112746245 A | 5/2021 |
| DE | 102012214925 B3 | 10/2013 |

(Continued)

OTHER PUBLICATIONS

Peck, J. et al., "Mechanism behind dry etching of Si assisted by pulsed visible laser," Journal of Applied Physics, vol. 122, No. 17, Nov. 2017, 8 pages, American Institute of Physics.

(Continued)

*Primary Examiner* — Asok K Sarkar
(74) *Attorney, Agent, or Firm* — Slater Matsil, LLP

(57) ABSTRACT

A method includes forming a first masking layer over a substrate, the first masking layer including a first mask line and a second mask line, heating respective top surfaces of the first mask line and the second mask line with polarized light, and forming a second masking layer over the first masking layer with an area selective deposition process. The second masking layer is thinner over a sidewall of the first mask line than over a top surface of the first mask line.

20 Claims, 21 Drawing Sheets

(56) References Cited

U.S. PATENT DOCUMENTS

2022/0190229 A1    6/2022   Wojtecki et al.
2022/0293419 A1    9/2022   Lu et al.

FOREIGN PATENT DOCUMENTS

| EP | 0470784 A2 | 2/1992 |
|----|------------|--------|
| JP | 2871712 B2 | 3/1999 |
| JP | 2003328140 A | 11/2003 |
| KR | 102287787 B1 | 8/2021 |

OTHER PUBLICATIONS

Peck, J. et al., "Sub-damage-threshold plasma etching and profile tailoring of Si through laser-stimulated thermal desorption," Journal of Vacuum Science Technology, vol. 36, No. 2, Mar./Apr. 2018, 8 pages, American Vacuum Society.

International Search Report and Written Opinion, PCT/US2024/018336, Mailed Jun. 28, 2024, Total pp. 10.

* cited by examiner

200

SYSTEM AND METHOD FOR SEMICONDUCTOR STRUCTURE

TECHNICAL FIELD

The present invention relates generally to a system and method for semiconductor processing, and, in particular embodiments, to a system and method for area selective deposition.

BACKGROUND

Dimension shrinkage is one of the driving forces in the development of integrated circuit processing. By reducing the size dimensions, cost-benefit and device performance boosts can be obtained. This scalability creates inevitable complexity in process flow, especially on patterning techniques. For example, as smaller circuits such as transistors are manufactured, the critical dimension (CD) or resolution of patterned features is becoming more challenging to produce, particularly in high volume. Self-aligned patterning may replace overlay-driven patterning so that cost effective scaling can continue even after the introduction of extreme ultraviolet (EUV) lithography. Patterning options that enable reduced variability, extend scaling, and enhance CD and process control are useful in a high-volume manufacturing environment; however, it is getting extremely difficult to produce scaled devices at reasonably low cost and high yield. Selective deposition, together with selective etch, can significantly reduce the cost associated with advanced patterning. Selective deposition of thin films such as gap fill, area selective deposition of dielectrics and metals on specific substrates, and selective hard masks are key steps in patterning in highly scaled technology nodes.

Area selective deposition (ASD) techniques may be advantageous for photoresist mask smoothing, but ASD techniques may present new challenges. Selectivity to different areas may frequently be material dependent, which can limit applicability of ASD techniques. A variety of material modification techniques exist for improved selectivity, such as atomic layer deposition (ALD) and atomic layer etching (ALE) style precursor adhesion and wettability alteration. However, concurrent or separately from any of these effects, improved deposition on tops of features may provide overall improvements to ASD techniques.

SUMMARY

In accordance with an embodiment, a method for an area selective deposition process includes: forming a first masking layer over a substrate, the first masking layer including a first mask line and a second mask line, where a trench between the first mask line and the second mask line has a first width; in a plasma processing chamber, heating respective top surfaces of the first mask line and the second mask line with polarized light, where the first width is smaller than half a wavelength of the polarized light; and in the plasma processing chamber, forming a second masking layer over the first masking layer with an area selective deposition process, where the second masking layer is thinner over a sidewall of the first mask line than over a top surface of the first mask line.

In accordance with another embodiment, a method for manufacturing a semiconductor structure includes: placing a substrate into a plasma processing chamber, a patterned first masking layer being over a target layer of the substrate; bombarding the patterned first masking layer with linearly polarized light, where a polarization direction of the linearly polarized light is aligned with a pattern of trenches through the patterned first masking layer; performing a first area selective deposition of a second masking layer over the patterned first masking layer; patterning the target layer using the second masking layer and the patterned first masking layer as an etching mask; and forming a pattern between remaining portions of the target layer.

In accordance with yet another embodiment, a plasma processing system includes: a plasma processing chamber; a chuck configured to hold a substrate; and an ellipsometer, the ellipsometer configured to provide polarized light to the substrate in the plasma processing chamber, the ellipsometer including a laser generator, a polarizing filter between the laser generator and the plasma processing chamber, a detector, and an analyzer between the detector and the plasma processing chamber.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

According to one or more embodiments of the present disclosure, this application relates to methods of area selective deposition (ASD) using polarized light to differentially heat features. Differential heating of top surfaces of features with light may improve reaction rates of an ASD precursor deposition process. Patterns with regularly spaced features (e.g., trenches or vias) may be differentially heated with linearly polarized light using an orientation and wavelength that reduce or prevent light from reaching respective bottoms of the features. Patterns with irregular or isolated features (e.g., curved waveguides) may have light preferentially delivered to tops of features using grazing incidence or circular polarization.

Embodiments of the disclosure are described in the context of the accompanying drawings. Embodiments of plasma processing systems will be described using FIGS. 1A, 1B, 2A, and 2B. Embodiments of a semiconductor manufacturing process will be described using FIGS. 3, 4A, 4B, 5, 6A, 6B, 7A, 7B, 7C, 8A, 8B, 9A, 9B, 10A, and 10B. An embodiment of a method for an area selective deposition process will be described using FIG. 11. An embodiment of a method for manufacturing a semiconductor structure will be described using FIG. 12.

Figure 1A:
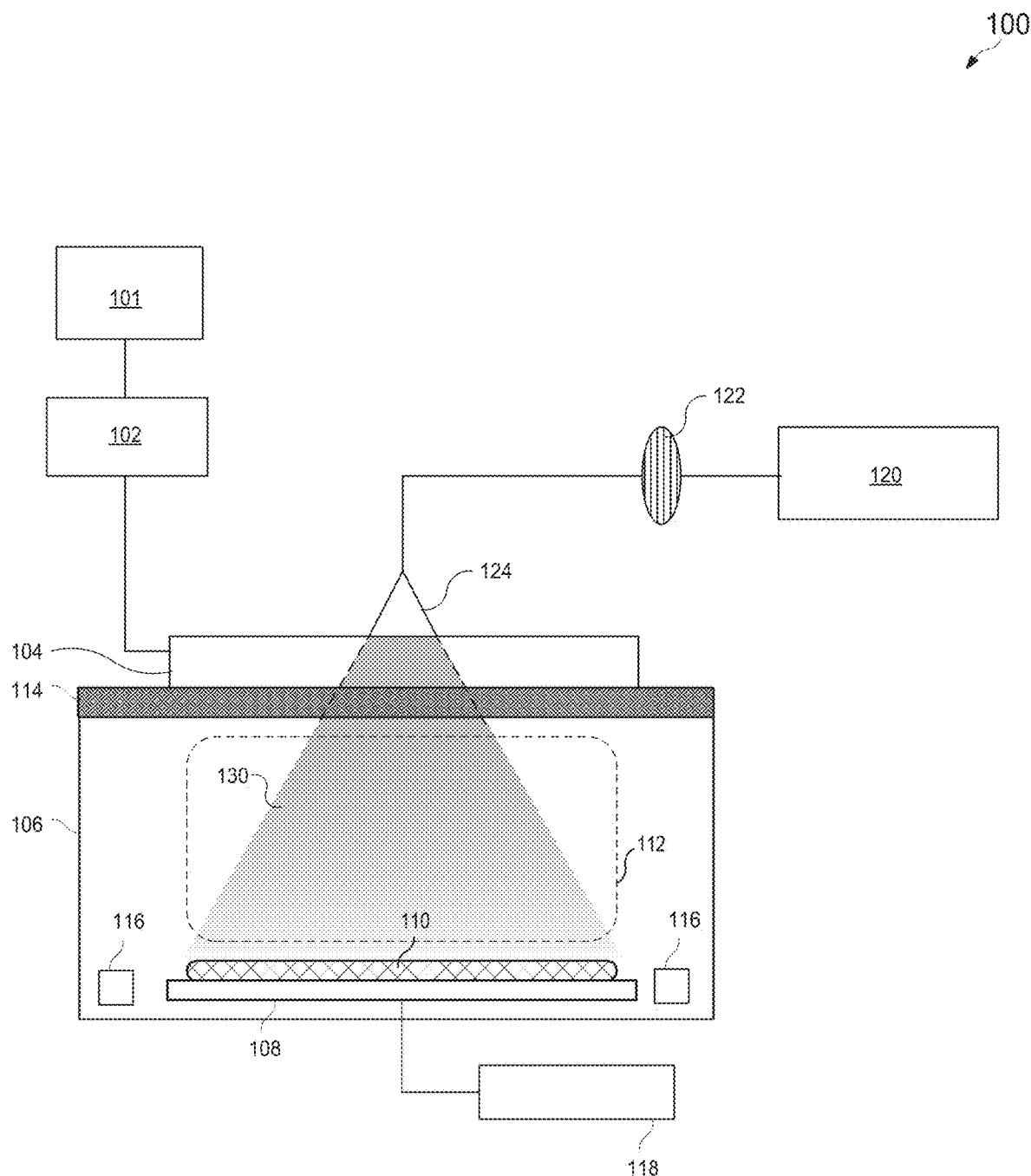
FIG. 1A illustrates a diagram of a plasma processing system, in accordance with some embodiments.

FIG. 1A illustrates a diagram of an embodiment plasma processing system 100 that operates using inductively coupled plasma (ICP), in accordance with some embodiments. Plasma processing system 100 includes an RF source 101, a matching circuit 102, an antenna 104, a plasma processing chamber 106, a polarized laser system including a laser generator 120, a polarizing filter 122, and a beam expander 124, and, optionally, a dielectric plate 114, which may (or may not) be arranged as illustrated in FIG. 1A. Further, plasma processing system 100 may include additional components not depicted in FIG. 1A.

In various embodiments, antenna 104 is coupled to an RF source 101 through a matching circuit 102. RF source 101 includes an RF power supply, which may include a generator circuit. RF source 101 provides forward RF waves to antenna 104, which are radiated towards plasma processing chamber 106. Throughout the description, the RF source 101 may be alternatively referred to as a power supply or RF source.

RF source 101 is coupled to matching circuit 102 and matching circuit 102 is coupled to antenna 104 via power transmission lines, such as coaxial cables or the like. The RF source 101 may be employed to provide RF power to the antenna 104 as a continuous wave (CW). In various embodiments, the RF source 101 may be employed to provide pulse-modulated RF power to the antenna 104.

Typically, a matching circuit (auto or manual) coupled to the radiating antenna is used to minimize losses (i.e., reflected power) in response to changes in the load condition. The matching circuit 102 (also referred to as a matching network or an impedance matching network) is coupled between the RF source 101 and the antenna 104. As forward power propagates from the RF source 101 to the antenna 104, some reflected power may be reflected back due to impedance mismatch between the plasma processing chamber 106 and the RF source 101. The matching circuit 102 is used to reduce reflected power by transforming the impedance looking into the matching circuit 102 (in other words, the impedance of the transmission lines, plasma process chamber 106, and antenna 104) to a same impedance as the RF source 101 and any intermediate transmission lines. This increases the efficiency of supplying power to the plasma processing chamber 106.

Plasma processing chamber 106 may be, e.g., a medium frequency (MF) or high frequency (HF) plasma chamber. The plasma processing chamber 106 may be a vacuum chamber. In some embodiments, the plasma processing chamber 106 is configured to operate plasma 115 at a first resonant frequency, wherein the first resonant frequency is in a range from about 1 MHz to about 27 MHz. For example, the plasma processing chamber 106 may be configured to operate plasma 115 at 1 MHz or more, 13.56 MHz or more, 27 MHz or more, or the like. However, any suitable plasma processing chamber 106 may be used and may generate plasma with any suitable method, such as DC plasma.

In various embodiments, plasma processing chamber 106 includes a substrate holder 108 (e.g., a chuck). As illustrated, substrate 110 (e.g., a semiconductor wafer) is placed on substrate holder 108 to be processed. Optionally, plasma processing chamber 106 may include a bias power supply 118 coupled to substrate holder 108. The plasma processing chamber 106 may also include one or more pump outlets 116 to remove by-products from plasma processing chamber 106 through selective control of gas flow rates within. In various embodiments, pump outlets 116 are placed near (e.g., below/around the perimeter of) substrate holder 108 and substrate 110. In various embodiments, plasma processing chamber 106 may include additional substrate holders (not illustrated). In various embodiments, the placement of the substrate holder 108 may differ from that illustrated in FIG. 1A. Thus, the quantity and position of the substrate holder 108 are non-limiting.

In various embodiments, antenna 104 radiates an electromagnetic field toward the plasma processing chamber 106. In an embodiment, antenna 104 includes arms connected to capacitive structures that generate the azimuthal symmetry. In various embodiments, the excitation frequency of the antenna 104 is in the radio frequency range (10-400 MHZ), which is not limiting, and other frequency ranges can similarly be contemplated. For example, inventive aspects disclosed herein equally apply to applications in the microwave frequency range. Various examples of designs for antennas 104 may be found in U.S. patent application Ser. No. 17/649,823, which is incorporated by reference herein in its entirety. However, any suitable antenna 104 may be used.

In various embodiments, antenna 104 is outside of plasma processing chamber 106 and is separated from plasma processing chamber 106 by the dielectric plate 114, which is typically made of a dielectric material. Dielectric plate 114 separates the low-pressure environment within plasma processing chamber 106 from the external atmosphere. It should be appreciated that antenna 104 can be placed directly adjacent to dielectric plate 114. In various embodiments, antenna 104 is separated from plasma processing chamber 106 by air. In various embodiments, the properties of the dielectric plate 114 are selected to minimize reflections of the RF wave from the plasma processing chamber 106. In other embodiments, antenna 104 is embedded within the dielectric plate 114. In various embodiments, dielectric plate 114 is in the shape of a disk. The dielectric plate 114 may be transparent or semitransparent to light, such as laser light produced by the laser generator 120.

The dielectric plate 114 includes a first outer surface and a second outer surface. The first outer surface faces the plasma processing chamber 106. The second outer surface faces the antenna 104. The second outer surface is above the first outer surface in a vertical direction.

In an embodiment, the antenna 104 couples RF power from RF source 101 to the plasma processing chamber 106 to treat substrate 110. In particular, antenna 104 radiates an electromagnetic wave in response to being fed the forward RF waves from RF source 101. The radiated electromagnetic wave penetrates from the atmospheric side (i.e., antenna 104 side) of the dielectric plate 114 into plasma processing chamber 106. The radiated electromagnetic wave generates an electromagnetic field within the plasma processing chamber 106. The generated electromagnetic field ignites and sustains plasma in a plasma generating region 112 by transferring energy to free electrons within the plasma processing chamber 106. The generated plasma can be used for a plasma process to, for example, selectively etch or deposit material on substrate 110. The plasma process may include an etch process such as a Reactive Ion Etch (RIE) process, an Atomic Layer Etch (ALE) process or the like, a deposition process such as a Plasma-Enhanced Physical Vapor Deposition (PVD) process, a Plasma-Enhanced Chemical Vapor Deposition (CVD) process, an Atomic Layer Deposition (ALD) process, an Area Selective Deposition (ASD) process, or the like.

In various embodiments, the plasma generating region 112 is immediately below the nearest portion of the dielectric plate 114 to the plasma processing chamber 106. In various embodiments, the upper most surface of the plasma generating region 112 corresponds to the plane where the outer surface of the dielectric plate 114 faces the plasma processing chamber 106.

In FIG. 1A, antenna 104 is external to plasma processing chamber 106. In various embodiments, however, antenna 104 can be placed internal to the plasma processing chamber 106. In such an embodiment, the plasma generating region 112 is immediately below the nearest portion of the antenna 104 to the plasma processing chamber 106.

The plasma processing system 100 includes a polarized laser system for treating the substrate 110 in order to improve selectivity for an area selective deposition (ASD) process performed on the substrate 110. The polarized laser system includes a laser generator 120, a polarizing filter 122, and a beam expander 124. In various embodiments, the laser generator 120 is a pulsed laser with, e.g., a pulse energy delivered to a wafer in a range of 3 mJ/cm$^2$/pulse to 1000 3 mJ/cm$^2$/pulse and a wavelength in a range of 170 nm to 3000 nm. The laser generator 120 may be configured to produce laser pulses with a duration of 20 femtoseconds to 100 milliseconds. The wavelength of the laser generator may be smaller than widths of trenches on the substrate 110.

Laser light from the laser generator 120 passes through a polarizing filter 122 and through a beam expander 124 into the plasma processing chamber 106 to target the substrate 110. The laser light may be guided through the polarizing filter 122 and the beam expander 124 by, e.g., an optical fiber or the like. In various embodiments, the polarizing filter 122 is a linear filter to produce linearly polarized laser light. In other embodiments, the polarizing filter 122 is a circular filter to produce circularly polarized light. The beam expander 124 widens the polarized laser beam in order to target a large portion of the substrate 110, or multiple substrates 110. In some embodiments, the beam expander 124 comprises one or more lenses. However, any suitable beam expander or focusing lens may be used.

Figure 1B:
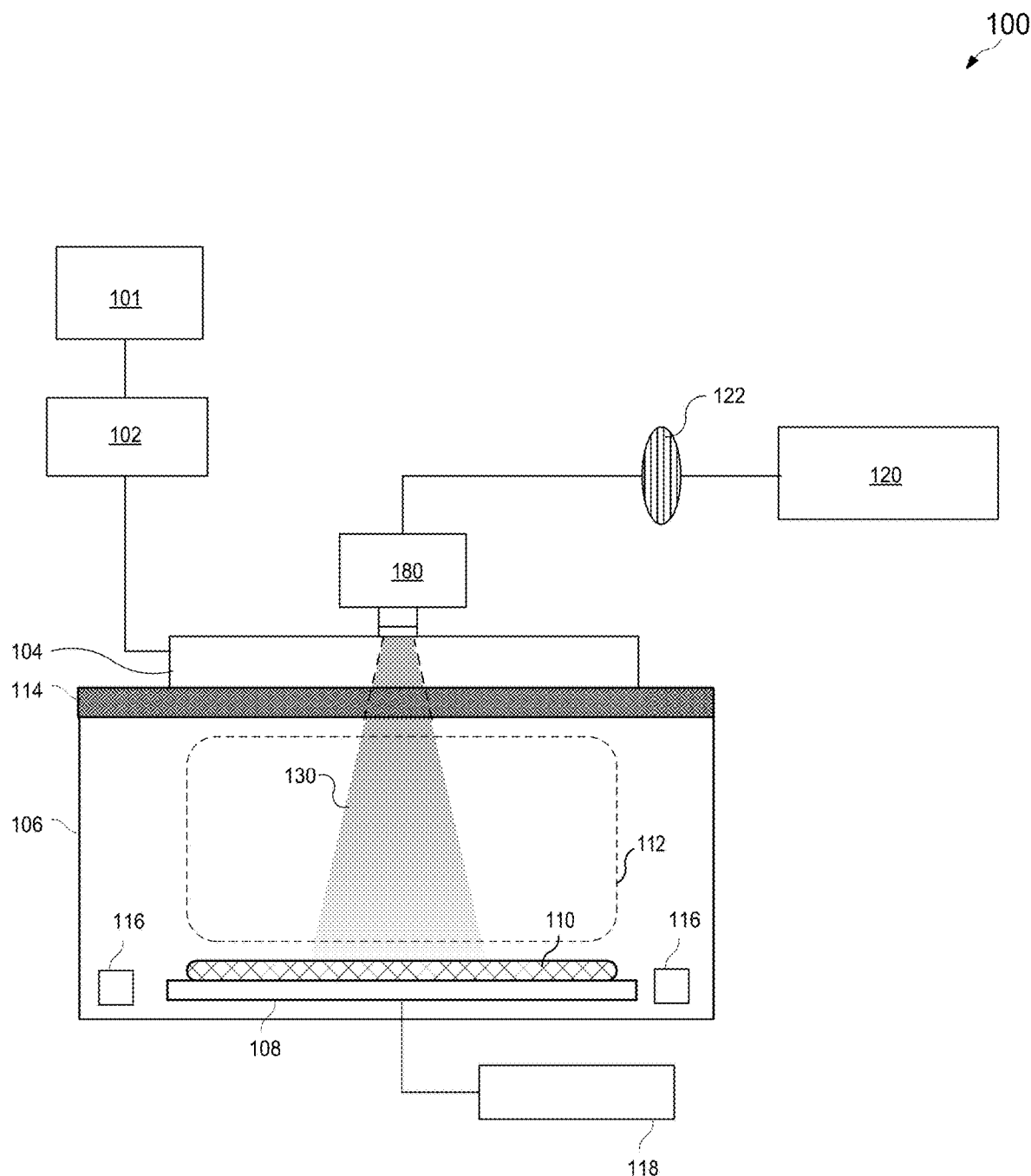
FIG. 1B illustrates a diagram of another plasma processing system, in accordance with some embodiments.

In some embodiments, as illustrated by FIG. 1B, the beam expander is or includes a digital light projection system 180 (also referred to as a digital projection system) as described in U.S. Pat. No. 10,147,655, which is hereby included by reference herein in its entirety. Additionally, the digital light projection system 180 may include mirrors with built-in polarizing gratings, so that the function of the polarizing filter 122 may also be performed by the digital light projection system 180 and a polarizing filter 122 external to the digital light projection system 180 may be omitted. As such, the digital light projection system 180 projects polarized light 130 into the plasma processing chamber 106. In some embodiments, the digital light projection system 180 illuminates specific spots on the substrate 110 as controlled by a program of the digital light projection system. For example, if more material is being etched in a center portion of the substrate 110, the digital light projection system 180 may illuminate only the center portion of the substrate 110, or may illuminate the center portion of the substrate 110 longer than an edge portion of the substrate 110. However, the digital light projection system 180 may illuminate any suitable portion of the substrate 110 for any suitable length of time.

Referring again to FIG. 1A, polarized light 130 from the beam expander 124 passes through the antenna 104 and the dielectric plate 114 (if present). The beam expander 124 may be aimed through a gap in the antenna 104 (e.g., a space between spiral arms of the antenna 104). The dielectric plate 114, if present, may be transparent to the polarized light 130. The plasma processing chamber 106 may have one or more openings or transparent windows (also referred to as view ports) adjacent to the beam expander 124 to allow the polarized light 130 to enter the plasma processing chamber 106. One or more window(s) added to the body of the plasma processing chamber 106 may be used to enable an ASD process if multiple light sources are in range of the window(s) or if the multiple light sources are swapped into and out of position (e.g., on a turret or a linear stage).

In some embodiments, the polarized light 130 penetrates plasma in the plasma generating region 112 to reach the substrate 110. In other embodiments, pulses of the polarized light 130 are synchronized to be out of phase with the pulsed power of the plasma in order to allow for better transmission through the plasma processing chamber 106 to the substrate 110.

The polarized light 130 may differentially deposit thermal energy on top surfaces of features on the substrate 110 rather than on sidewalls or bottom surfaces of features (e.g., mask lines having trenches between them) on the substrate 110. In other words, the polarized light 130 enables preferential heating of, e.g., trench tops. This heating of top surfaces of features with the polarized light 130 may improve reaction rates of an ASD precursor deposition process (see below, FIGS. 5, 6A, and 6B). A wide process range is enabled, as the energy of the laser generator may be tuned over a range from less than 1 mJ/cm$^2$/pulse to an ablation threshold of 400-600 mJ/cm$^2$/pulse, depending on the type of material of the features, other plasma conditions, or the like. Additionally, adhesion on top surfaces may be altered by the polarized light 130 as a function of temperature to drive reaction rates or molecular decomposition on the top surfaces. As pulse heating from pulsed polarized light 130 may dissipate rapidly, the preferential heating by polarized light bombardment may be useful for thin resists (e.g., EUV resists) and short features. The preferential heating by polarized light bombardment is not dependent on chemical or substrate material selectivity and may be used with any suitable ASD precursor or substrate material.

Preferentially delivering thermal energy to the tops of the features may allow for desirable adhesion of precursors and/or desorption of undesirable contaminants and reaction byproducts as well as tuning of reaction rate kinetics without causing undesirable ablation of material on the substrate 110. Improved selectivity of deposition enabled by the polarized light bombardment may improve on existing chemical selectivity of ASD processes, such as for high aspect ratio features. This may desirably increase reaction rates and lead to higher process throughput. Additionally, the improved ASD by polarized light bombardment can enable smoothing of mask features (e.g., reduction of line edge roughness (LER)) or expansion of masks (e.g., tuning of double patterning or correction of lithography) with better selectivity between mask and underlayer as well as selectivity between masks and underlayers that may have been previously not achievable with ASD processes. In some embodiments, improved masks formed with greater amounts of material deposited on top surfaces of mask features by the polarized light bombardment allow for new hard masks to be generated. This may be done by etching of an underlying hard mask layer using the improved masks as an etching mask. The improved ASD by polarized light bombardment may be used to improve a pattern in a photoresist after a patterning step, to recover a pattern of a mask partially through an etch process (or sequence of etch processes) as the mask is degrading, to regenerate a mask on a partially etched structure by preferentially depositing on top surfaces of lines, the like, or a combination thereof. For example, a single process could include three improved ASD by polarized light bombardment steps: a first step improving the pattern of a mask before an etch, a second step recovering a mask pattern partially through an etch, and a third step regenerating the mask after the original mask has been consumed.

In embodiments in which the polarized light 130 is linearly polarized, the linearly polarized light may have an orientation and wavelength that reduces or prevents light from reaching bottoms of regularly spaced features (e.g., trenches or vias). For example, laser wavelength may be chosen to be smaller than trench widths. The linear polarization of the polarized light 130 thereby allows thermal energy to be deposited on top surfaces of features (e.g., on tops of mask lines adjacent to trenches) while avoiding trench bottoms that are oriented 90 degrees out of phase with the direction of linear polarization. However, trenches that are oriented in phase with the direction of linear polarization may receive heating on respective bottoms surfaces of the trenches. Targeting of feature tops does not depend on depths of features (e.g., trenches) but on pitches between the features. As such, the polarized light bombardment 130 may be used with features with high aspect ratio (e.g., deep trenches), low aspect ratio (e.g., shallow trenches), or a combination thereof (e.g., staircase style structures or etches).

Figure 2A:
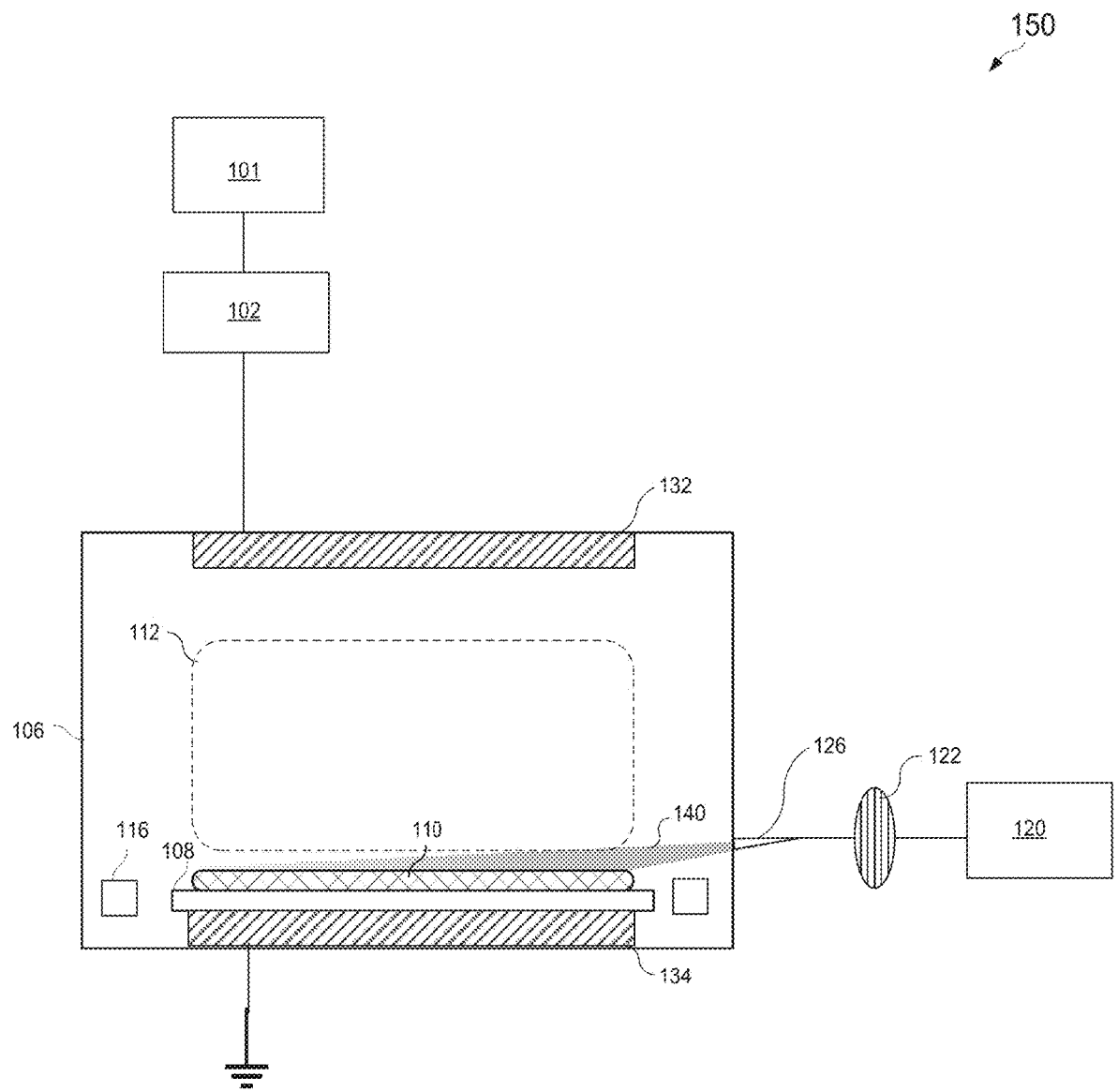
FIG. 2A illustrates a diagram of another plasma processing system, in accordance with some embodiments.

FIG. 2A illustrates a diagram of an embodiment plasma processing system 150 that operates using capacitively coupled plasma (CCP), in accordance with some embodiments. Plasma processing system 100 includes an RF source 101, a matching circuit 102, a first electrode 132, a second electrode 134, a plasma processing chamber 106, a polarized laser system including a laser generator 120, a polarizing filter 122, and a beam focuser 126, which may (or may not) be arranged as illustrated in FIG. 2A. Further, plasma processing system 100 may include additional components not depicted in FIG. 2A.

The first electrode 132 is located in the plasma processing chamber 106 above the substrate holder 108 and is coupled to the RF source 101, e.g. through the matching circuit 102. The second electrode 134 is located in the plasma processing chamber 106 below the substrate holder 108. In some embodiments, the second electrode 134 is coupled to ground. In other embodiments, the second electrode 134 is coupled to another RF source, e.g. through another matching circuit. An electric field is generated between the first electrode 132 and the second electrode 134, which act as opposite plates of a capacitor. The electric field ignites and couples power to a plasma in the plasma generating region 112. The generated plasma can be used for a plasma process such as, for example, an area selective deposition (ASD) process, or another plasma process as described above with respect to FIG. 1A.

As the first electrode 132 may be located over the substrate holder 108 (and over a mounted substrate 110), in some embodiments the polarized laser system is positioned to project polarized light 140 through a sidewall of the plasma processing chamber 106 rather than through a top surface of the plasma processing chamber 106. The polarized light system includes a beam focuser 126 that is coupled to the laser generator 120 through the polarizing filter 122 by, e.g., an optical fiber or the like. The beam focuser 126 may be positioned at an opening or transparent window into the plasma processing chamber 106 above a top surface of the substrate holder 108. As such, the polarized light system may be included with any existing plasma chamber design that is compatible with an opening or transparent window in a suitable position. The beam focuser 126 focuses the polarized laser beam in order to target a large portion of the substrate 110, or multiple substrates 110. In some embodiments, the beam focuser 126 comprises one or more lenses. However, any suitable beam focuser 126 may be used.

Figure 2B:
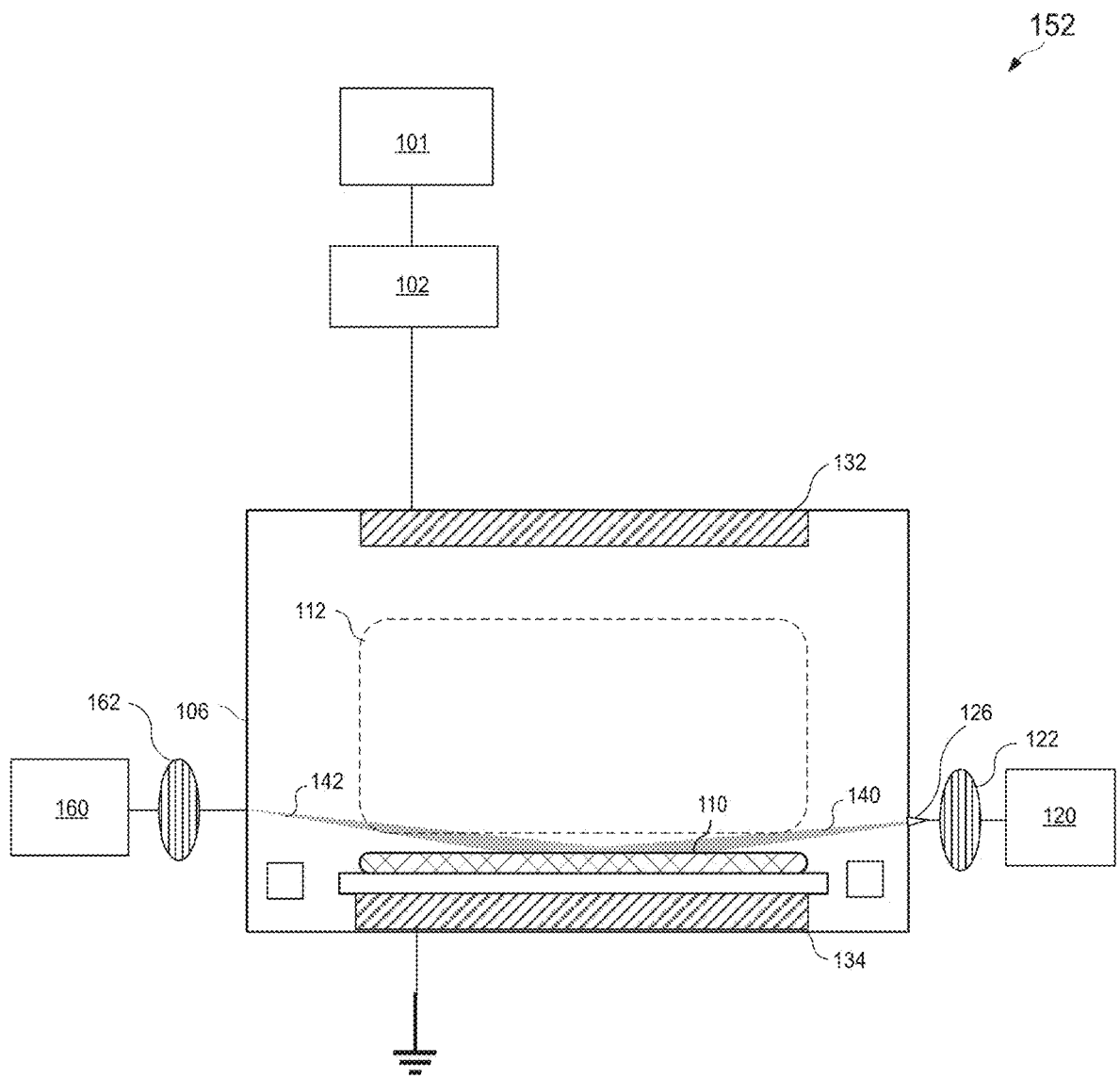
FIG. 2B illustrates a diagram of another plasma processing system, in accordance with some embodiments.

FIG. 2B illustrates a diagram of an embodiment plasma processing system 152 that includes an ellipsometer, in accordance with some embodiments. Although the plasma processing system 152 is illustrated similar to the plasma processing system 150 (see above, FIG. 2A) that operates using capacitively coupled plasma (CCP) with polarized light 140 projected through a sidewall of the plasma processing chamber 106, the plasma processing system 152 may also operate using inductively coupled plasma (ICP) and project polarized light 140 through a top surface of the plasma processing chamber 106 (see above, FIGS. 1A-1B).

The polarized laser system comprises an ellipsometer in conjunction with a polarizing filter 122. The ellipsometer may be used to focus on a single spot of the substrate 110. The ellipsometer comprises a light source (e.g., a laser generator 120; see above, FIG. 1A), a polarizing filter 122, and a detector 160 with associated optics such as an analyzer 162 (e.g., a second polarizing filter) and an optional compensator (e.g., a quarter wave plate) between the detector 160 and the plasma processing chamber 106. The polarized light 140 hits a single spot of the substrate 110, from which reflected polarized light 142 is received by the detector 160 through the analyzer 162. The detector 160 measures the change in the polarization of the reflected polarized light 142 from the polarization of the polarized light 140, which may be used to, for example, provide feedback on the physical properties of the substrate 110. The vertical positions of the laser generator 120 and the detector 160 with respect to the substrate 110 may be different from their illustration in FIG. 2A. For example, in some embodiments, the laser generator 120 and the detector 160 are above the substrate 110 so that the incident angle of the polarized light 140 and the reflected angle of the reflected polarized light 142 are in a range of 40° to 70°. However, any suitable vertical positions of the laser generator 120 and the detector 160 may be used.

Although FIGS. 1A, 1B, 2A, and 2B illustrate embodiments of the ICP plasma processing system 100 having a polarized light system providing polarized light through a top surface of the plasma processing chamber 106 and the CCP plasma processing systems 150 and 152 having a polarized light system providing polarized light through a sidewall of the plasma processing chamber 106, in other embodiments the ICP plasma processing system 100 has a polarized light system providing polarized light through a sidewall of the plasma processing chamber 106 and the CCP plasma processing systems 150 and 152 have a polarized light system providing polarized light through a top surface of the plasma processing chamber 106. For example, an embodiment of the CCP plasma processing system 150 may have a beam expander 124 positioned at a top surface of the plasma processing chamber 106 such that the first electrode 132 does not block a path of the polarized light 140 to the substrate holder 108.

Embodiments in which the polarized light 140 is linearly polarized may enable selectivity to the tops of features (e.g., trench tops) on the substrate 110. The substrate holder 108 may be rotated during bombardment with polarized light 140 to increase uniformity of heating across the substrate 110. Embodiments in which the polarized light 130 is circularly polarized may preferentially deliver light to tops of shallow, irregular, or isolated features (e.g., curved waveguides). In some embodiments, non-polarized light may be used at a grazing incidence to target the tops of features on the substrate 110. Rotating the substrate holder 108 during polarized light bombardment and using circularly polarized light or non-polarized light at a grazing incidence may also be used in embodiments of the ICP plasma processing system 100 (see above, FIG. 1A).

FIGS. 3, 4A, 4B, 5, 6A, 6B, 7A, 7B, 8A, 8B, 9A, 9B, 10A, and 10B illustrate various cross-sectional and top views of intermediate steps of an example semiconductor manufacturing process, in accordance with some embodiments. The example semiconductor manufacturing process demonstrates an area selective deposition (ASD) process over an EUV-patterned metal-based resist (MBR). The ASD process is preceded by a polarized light bombardment to increase selectivity to top surfaces of features. However, embodiments of polarized light bombardments may be used with any suitable ASD process (including processes with non-MBR photoresists that are not patterned with EUV), and all such combinations are within the scope of the disclosed embodiments.

Figure 3:
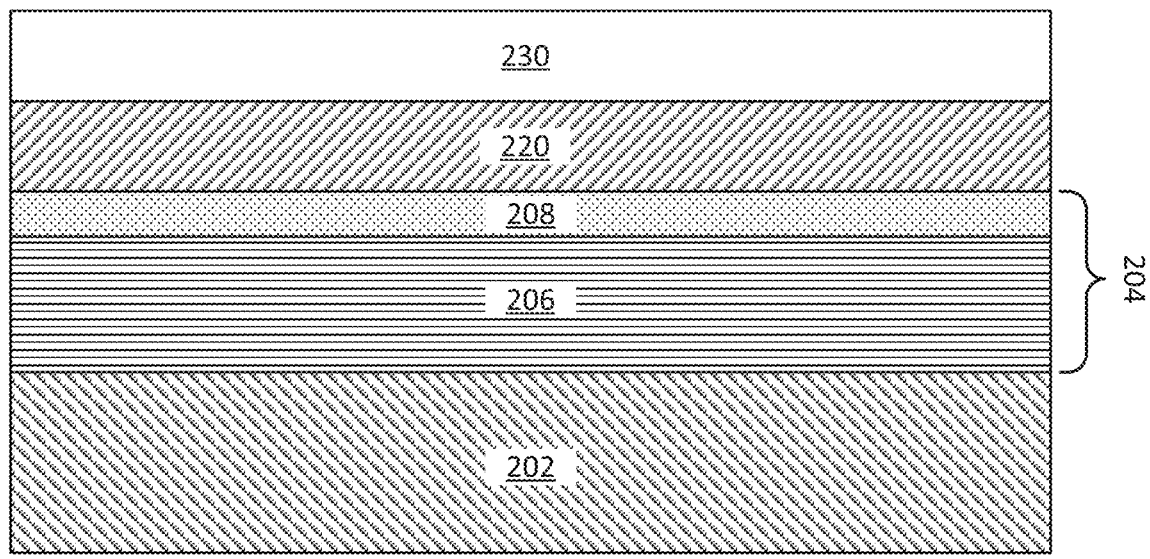
FIGS. 3, 4A, 4B, 5, 6A, 6B, 7A, 7B, 7C, 8A, 8B, 9A, 9B, 10A, and 10B illustrate various cross-sectional and top views of intermediate steps of a semiconductor manufacturing process, in accordance with some embodiments.

FIG. 3 illustrates a cross-sectional view of a semiconductor structure 200, in accordance with some embodiments. The semiconductor structure 200 includes a substrate 202 and a target layer 204 over the substrate 202. In some embodiments, the substrate 202 may be a silicon wafer, or a silicon-on-insulator (SOI) wafer. In certain embodiments, the substrate 202 may comprise a silicon germanium wafer, silicon carbide wafer, gallium arsenide wafer, gallium nitride wafer, and other compound semiconductors. In other embodiments, the substrate 202 comprises heterogeneous layers such as silicon germanium on silicon, gallium nitride on silicon, silicon carbon on silicon, as well layers of silicon on a silicon or SOI substrate. In various embodiments, the substrate 202 is patterned or embedded in other components of the semiconductor device. In various embodiments, the substrate 202 may be a part of a semiconductor device, and may have undergone a number of steps of processing following, for example, a conventional process. The substrate 202 accordingly may comprise layers of semiconductors useful in various microelectronics. For example, the semiconductor structure 200 may comprise a substrate 202 in which various device regions are formed.

In some embodiments, the target layer 204 includes a dielectric layer 206 and a hardmask layer 208. The dielectric layer 206 is formed over the substrate 202 and the hardmask layer 208 is formed over the dielectric layer 206. The dielectric layer 206 is the layer to be patterned using the hardmask layer 208 as an etch mask, after the hardmask layer 208 has been subsequently patterned (see below, FIGS. 8A-8B). After being patterned, a metallization pattern is formed in trenches through the dielectric layer 206 (see below, FIGS. 9A-10B). In some embodiments, the dielectric layer 206 is a silicon-based dielectric material with a low dielectric constant (i.e., low-k value) such as organosilicate glass (SiCOH), dense SiCOH, porous SiCOH, and other porous dielectric materials. In some embodiments, the hardmask layer 208 comprises titanium nitride, titanium, titanium oxide, tantalum, tungsten carbide, other tungsten based compounds, ruthenium based compounds, aluminum based compounds, amorphous silicon, silicon nitride, silicon carbide, or the like. However, any suitable materials may be used for the dielectric layer 206 and the hardmask layer 208.

In some embodiments, an underlying layer 220 is formed over the target layer 204. The underlying layer 220 may be a bottom antireflective coating (BARC) that may double as a hardmask layer for etching a portion of a layer below the underlying layer 220. Examples of materials used for forming the underlying layer 220 include spin-on glass (SOG), silicon-containing antireflective coating (SiARC), silicon carbide (SiC), silicon oxycarbide (SiOC), silicon carbonitride (SiCN), silicon oxycarbonitride (SiOCN), organic BARC, or a combination thereof.

A first mask material comprising a metal-based resist (MBR) is deposited on the underlying layer 220, the deposition forming an MBR layer 230. In some embodiments, the MBR comprises a metal oxide nanoparticle or a nanocluster, the metal comprising hafnium, zirconium, titanium, tin, zinc, indium, or aluminum. The MBR may also include an organometallic complex, where the metal may be antimony, tin, bismuth, tellurium, platinum, palladium, cobalt, iron, or chromium.

Generally, the resist layer (e.g., the MBR layer 230) and the antireflective coating-cum-hardmask (e.g., the underlying layer 220) are layers of a sacrificial lithography stack that may be patterned and used as an etch mask to pattern a layer below the lithography stack that is included in a device structure. Sometimes, the layer adjacent below the lithography stack may be referred to as a base layer. For example, the target layer 204 disposed adjacent below the underlying layer 220 in FIG. 3 may be referred to as a base layer.

Figure 4A:
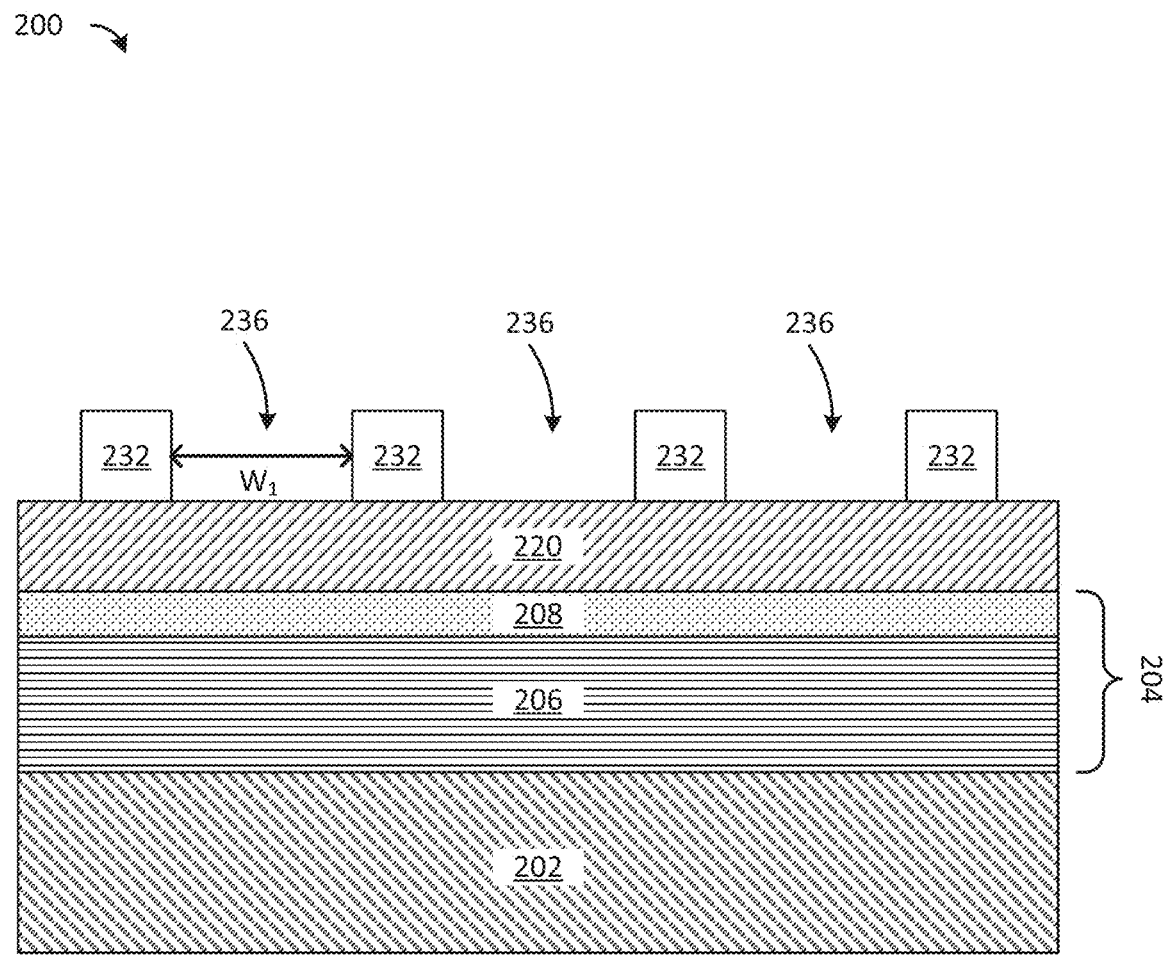
Figure 4B:
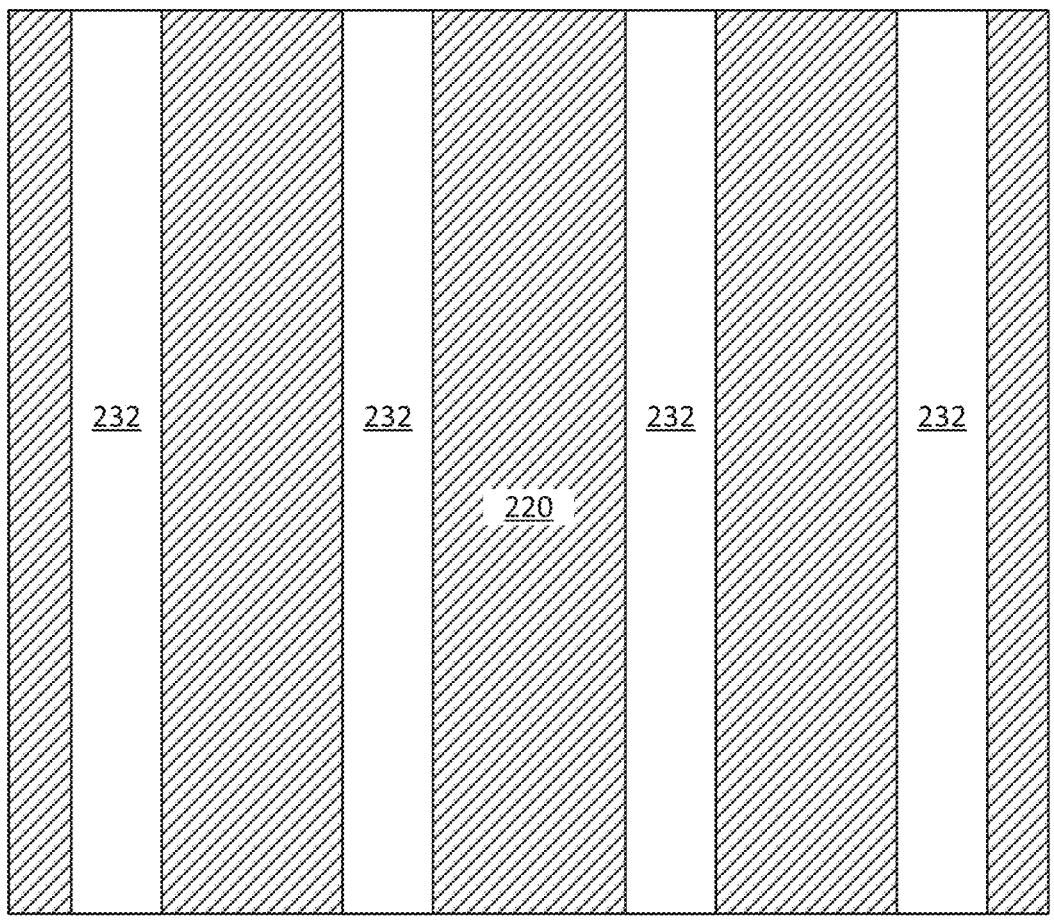

FIGS. 4A and 4B illustrate respective cross-sectional and top views of the semiconductor structure 200 following from FIG. 3, in accordance with some embodiments. In FIGS. 4A and 4B, the MBR layer 230 is patterned using, e.g., an extreme ultraviolet (EUV) lithography process to form a patterned MBR layer, referred to as a first masking layer 232. The first masking layer 232 exposes a portion of the underlying layer 220 at bottom surfaces of a pattern of trenches 236 between portions of the first masking layer 232 (also referred to as mask lines), as illustrated in cross-sectional view in FIG. 4A and in top view in FIG. 4B. In some embodiments, trenches 236 have a first width W1 that is half a wavelength of the developing radiation (e.g., EUV light with a wavelength of 13.5 nm), such as in a range of 7 nm to 10 nm. In order to deposit thermal energy during the ASD process, the width W1 is desirably less than half of the light source used for the ASD process. As an example, if a 193 nm ArF laser was used to provide developing radiation, the width W1 would desirably be 96.5 nm or smaller.

Figure 5:
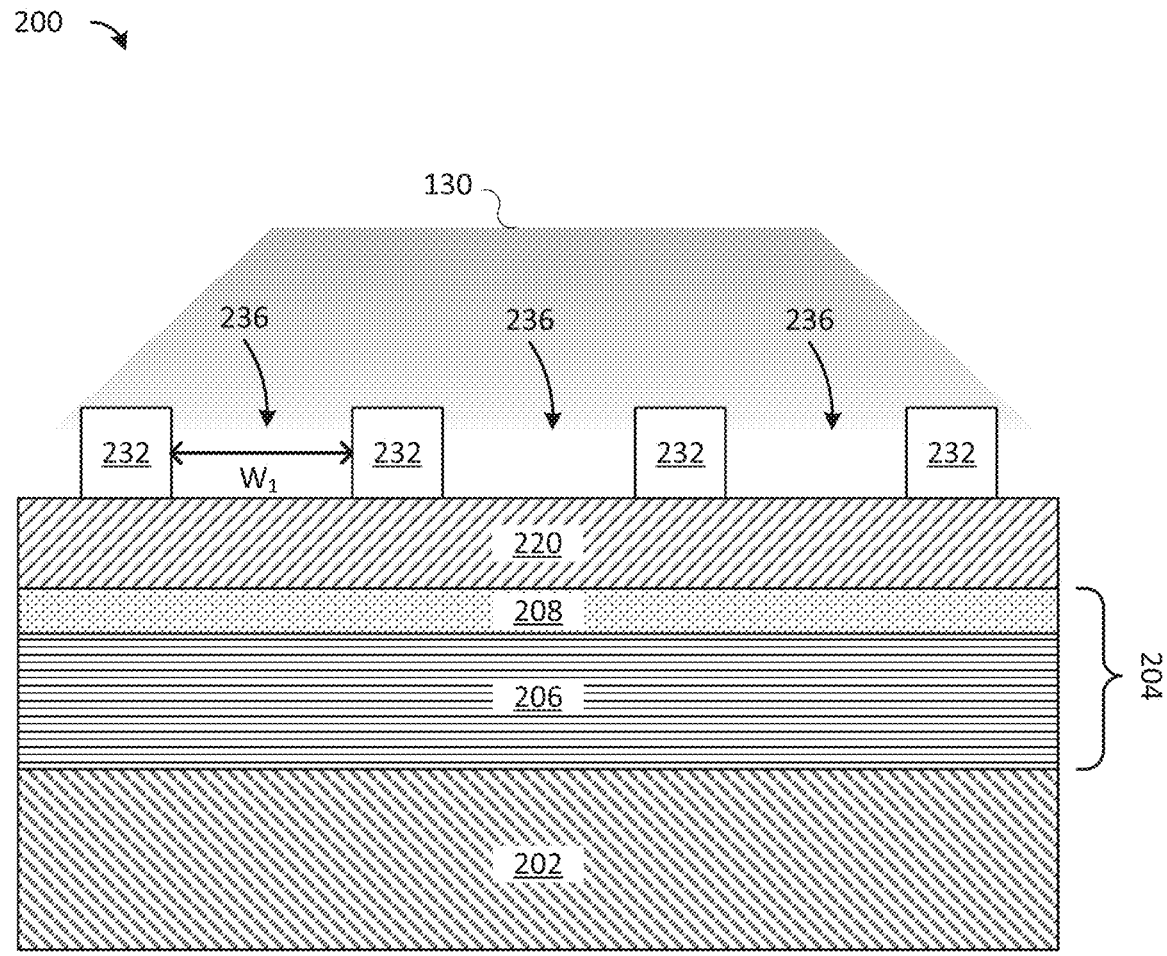

FIG. 5 illustrates a cross-sectional view of the semiconductor structure 200 during a polarized light bombardment. After forming the first masking layer 232, the semiconductor structure 200 is transferred to a plasma chamber (for example, the plasma processing chamber 106 of an ICP plasma processing system 100 or a CCP plasma processing system 150; see above, FIGS. 1A, 1B, and 2). Polarized light 130 is used to bombard the semiconductor structure 200, thereby preferentially heating top surfaces of the first masking layer 232 while not heating bottom surfaces of the trenches 236. As such, after heating the respective top surfaces of the first masking layer 232 with polarized light, a temperature of the respective top surfaces of the first masking layer 232 is higher than a temperature of a bottom surface of the trenches 236.

In some embodiments, the polarized light 130 is linearly polarized with a wavelength that is larger than the first width W1 of the trenches 236. However, any suitable linearly or circularly polarized light 130 or 140 may be used, as described above with respect to FIGS. 1A, 1B, and 2. The differential deposition of thermal energy into top surfaces of the first masking layer 232 may improve a subsequent area selective deposition process (see below, FIGS. 6A and 6B) by, e.g., increasing deposition on top surfaces of the first masking layer 232 relative to sidewalls of the first masking layer 232. In some embodiments where the polarized light 130 is linearly polarized, a polarization direction of the polarized light 130 is aligned with the pattern of trenches 236.

Figure 6A:
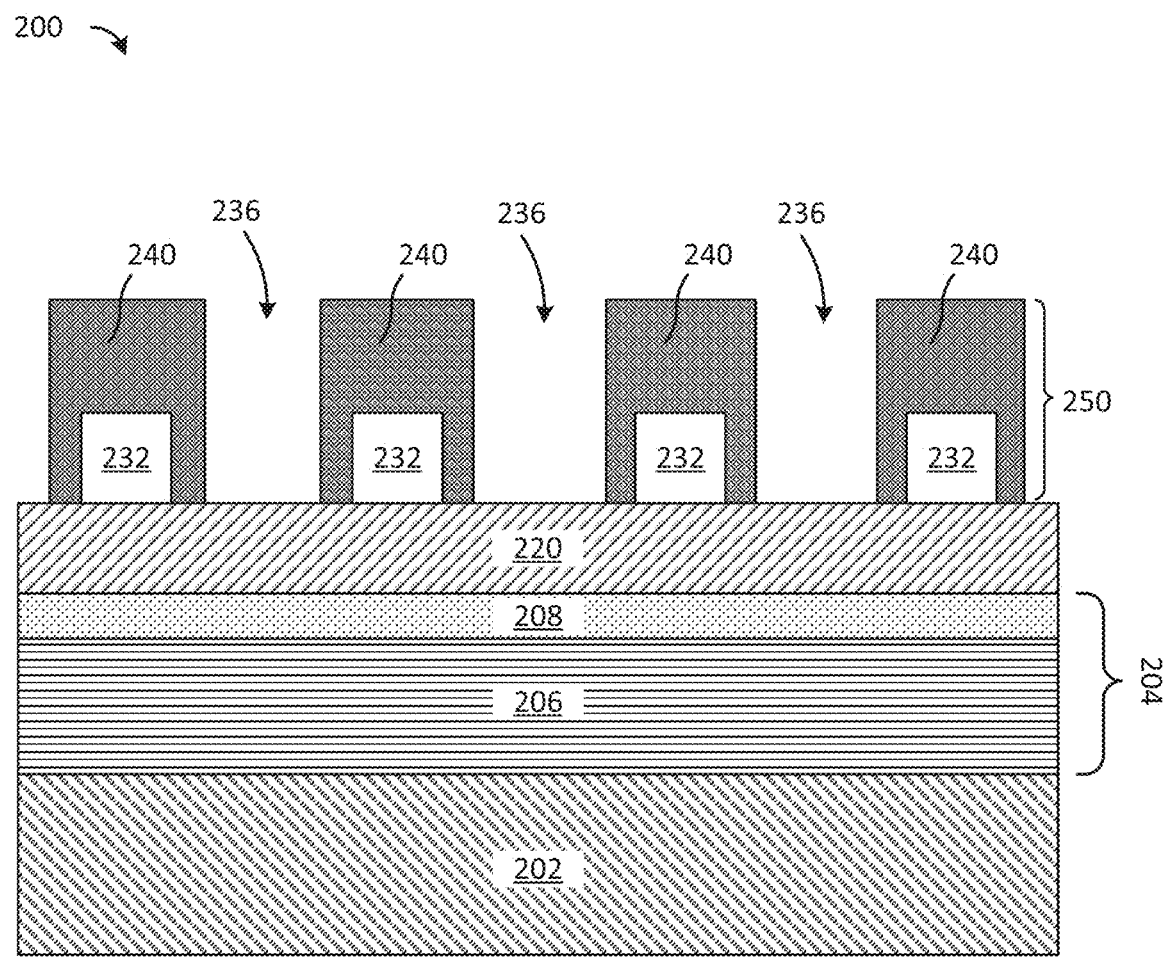
Figure 6B:
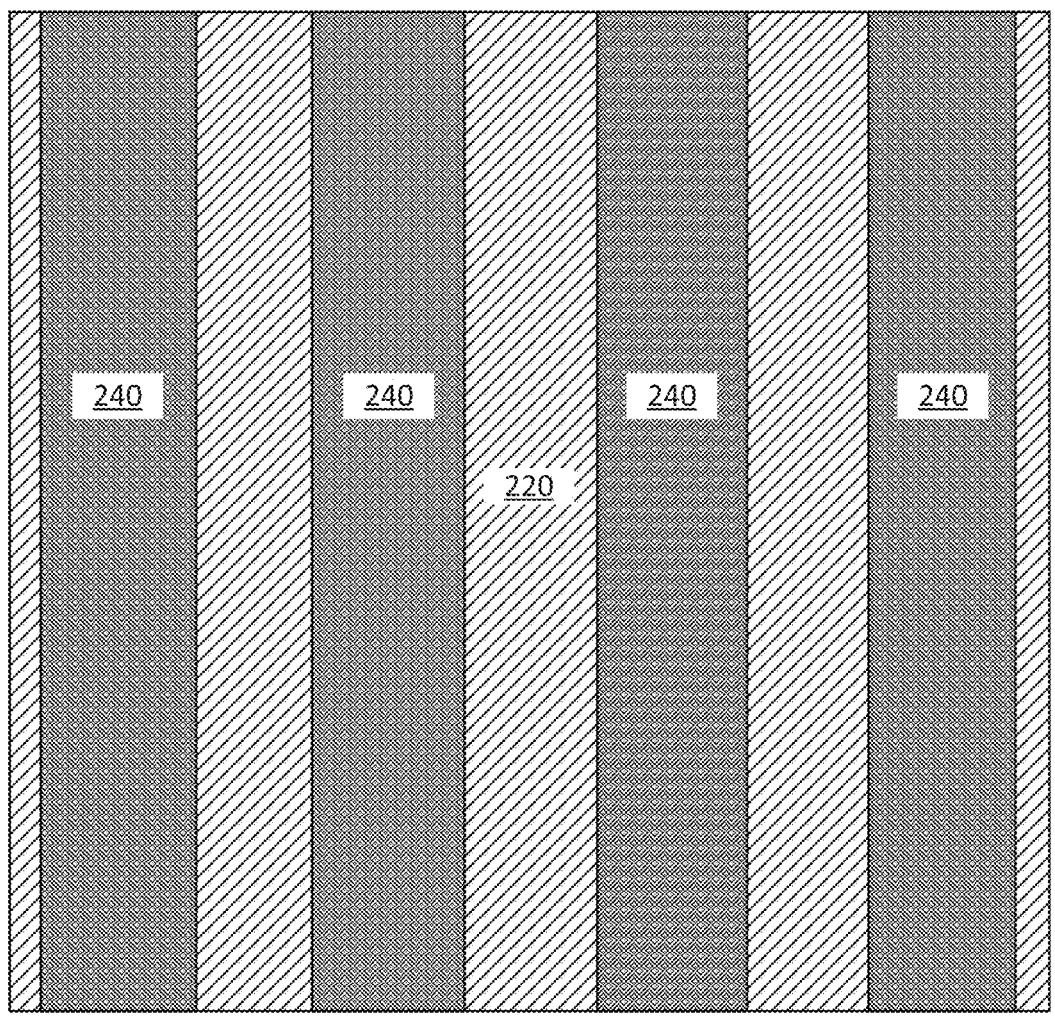

FIGS. 6A and 6B illustrate respective cross-sectional and top views of the semiconductor structure 200 following from FIG. 5, in accordance with some embodiments. A first plasma is used to deposit a second masking layer 240 in the plasma processing chamber 106. The first plasma comprises a source gas that reacts chemically selectively with the first masking layer 232 relative to the underlying layer 220. The semiconductor structure 200 is exposed to the first plasma to deposit a second mask material selectively on the first masking layer 232. By proper selection of process parameters of the plasma deposition process, the chemical selectivity of the reaction may be utilized to perform an area selective deposition (ASD) process to form a second masking layer 240. As illustrated in the cross-sectional view in FIG. 6A, the second mask material deposits over the first masking layer 232 (the patterned MBR layer), while a negligible thickness of the second mask material (not illustrated) is formed over a portion of the underlying layer 220 not covered by the first masking layer 232.

In some embodiments, forming the second masking layer 240 may include performing an optional in situ trim etch process that removes a portion of the deposited second mask material. In embodiments where the second mask material comprises a silicon-based material, the trim etch process may be a plasma etch using fluorocarbons, fluorine, chlorine, or hydrogen bromide as an etchant. In embodiments where the second mask material comprises an organic material, the etchant may comprise CO, $CH_4$, $CO_2$, $O_2$, or the like. One purpose for performing the trim etch process is to open a larger portion of the space between resist lines that may be covered by the second mask material along sidewalls of the lines.

In the example embodiment illustrated in FIG. 6A, the completed second masking layer 240 has a thinner layer of the second mask material along a sidewall of the first masking layer 232 compared to a thickness of the second mask material over a substantially flat top surface of the first masking layer 232. The preferential deposition of a greater proportion of second mask material on top surfaces of the first masking layer 232 compared to deposition of the second mask material on sidewalls of the first masking layer 232 may be increased by the prior heating of the top surfaces of the first masking layer 232 by polarized light, as described above with respect to FIG. 5. The second mask material and the processes used to form the second masking layer 240 may be selected such that some of the roughness along the sidewall of the first masking layer 232 is smoothed out. The combined first masking layer 232 and the second masking layer forms an etch mask 250 that may be used in a subsequent etch process to pattern the underlying layer 220.

In some embodiments, the ASD process is used to deposit an amorphous material comprising silicon as the second mask material. The first plasma used to deposit the silicon comprises silane ($SiF_4$) as the source gas and an inert gas (e.g., argon, nitrogen, or helium) as a diluent gas. In some embodiments using silane as the source gas, the first plasma may include additive gases such as $H_2$, $SiCl_4$, $CH_4$, $CH_xF_{4-x}$, or a mixture thereof.

Additionally, the gaseous mixture used for the first plasma may be selected to deposit an organic polymer as the second mask material. The first plasma used to deposit the organic polymer comprises carbon monoxide (CO) as the source gas and an inert diluent gas (e.g., argon, nitrogen, or helium). In some embodiments using CO as the source gas, the first plasma may include additive gases such as $H_2$, $CH_4$, $CH_xF_{4-x}$, $CO_2$, $O_2$, or a mixture thereof.

Figure 7A:
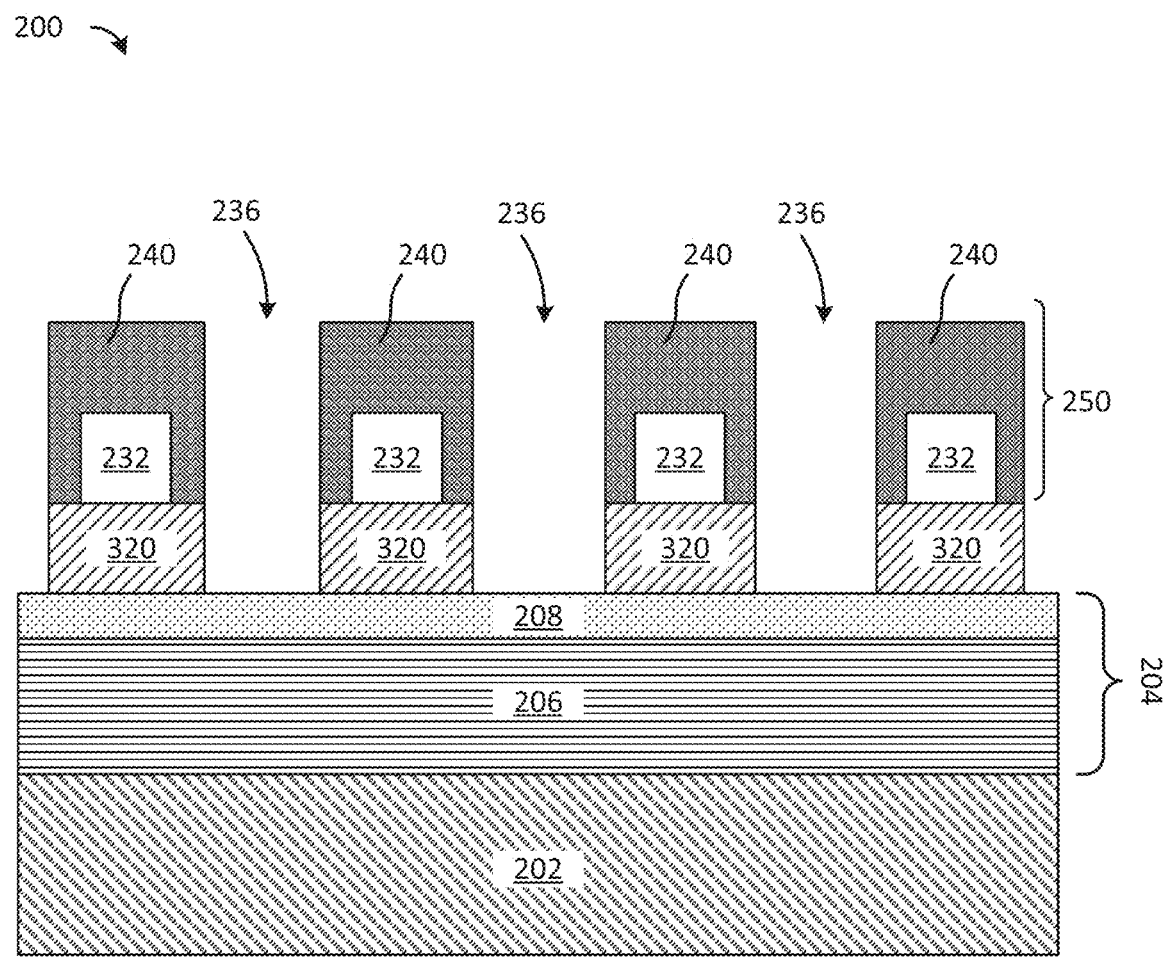
Figure 7B:
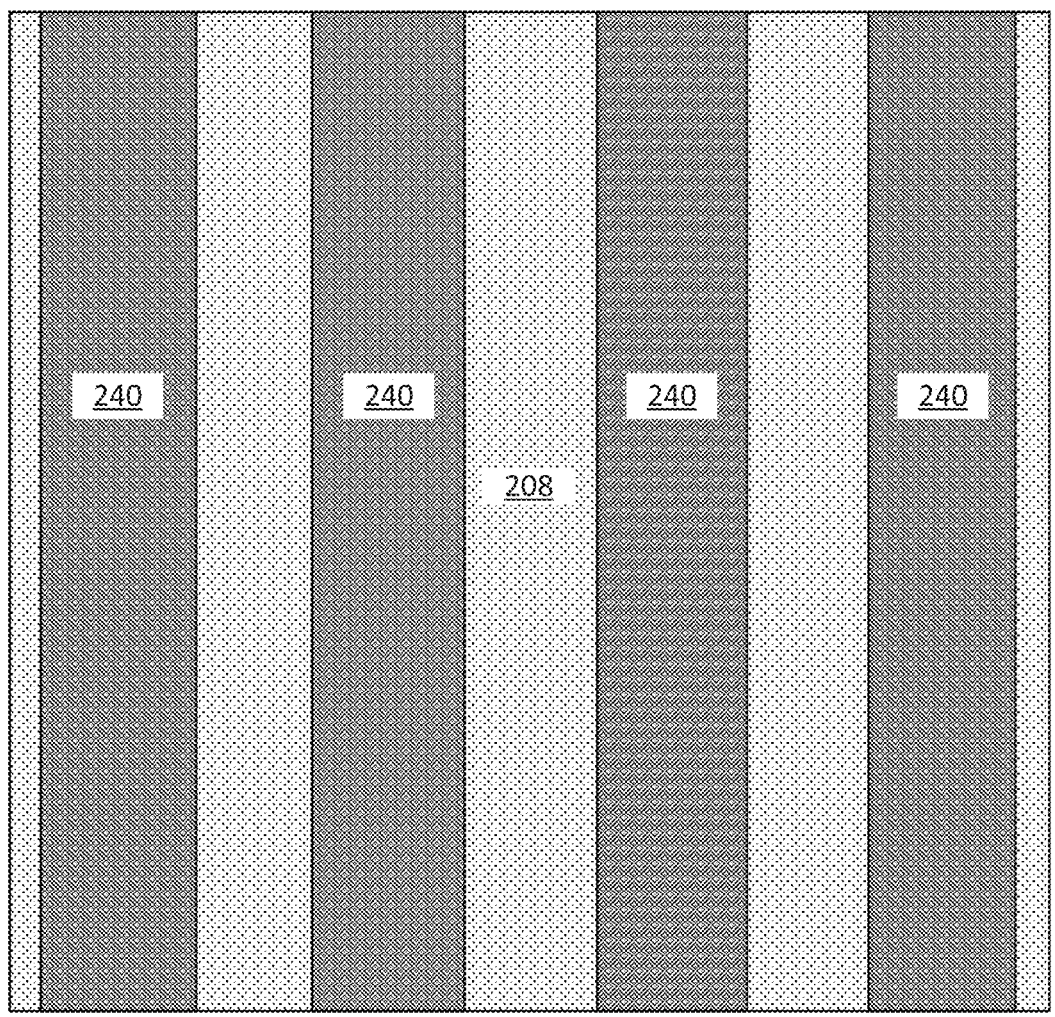

Next, in FIGS. 7A and 7B, after the etch mask 250 comprising the first masking layer 232 and the second masking layer 240 has been formed, an etch process is performed to transfer the pattern of the etch mask 250 to the underlying layer 220, thereby forming a patterned underlying layer 320. In some embodiments, the underlying layer 220 may be etched in situ by a plasma etch process by generating a second plasma in the same plasma chamber where the first plasma was generated. In some other embodiments, the pattern transfer etch with the etch mask 250 may be performed after transferring the substrate to some other processing equipment. The second plasma comprises etchants that remove the material of the underlying layer 220. For example, if the underlying layer 220 comprises spin-on glass (SOG), silicon-containing antireflective coating (SiARC), silicon carbide (SiC), silicon oxycarbide (SiOC), silicon carbonitride (SiCN), or silicon oxycarbonitride (SiOCN), the second plasma may be using a fluorine based or a chlorine based etch chemistry. If the underlying layer 220 comprises an organic BARC then the second plasma may comprise a fluorocarbon, HBr, $O_2$, $CO_2$, CO, or the like. The plasma etching comprises exposing the substrate to the second plasma for a fixed etch duration or terminating the etch process based on an endpoint signal. In some embodiments, the plasma etching may be a substantially anisotropic etching process. As illustrated in FIG. 7A, a portion of the etch mask 250 may be removed by the second plasma by the time the etch process is completed. In this example, a portion of the second masking layer 240 has been lost during etching. In some other example, the etching may remove the entire second masking layer 240 and, in some instances, a portion of the first masking layer 232.

The method described with references to FIGS. 5 and 6A-7B illustrate an example embodiment where the polarized light bombardment, the ASD process, and the pattern transfer etch used to form the patterned underlying layer are single step processes. In some other embodiments, a method may be used in which a cyclic deposition and etch process is performed in the plasma process chamber 106 to pattern an underlying layer disposed adjacent below a patterned MBR layer.

Figure 7C:
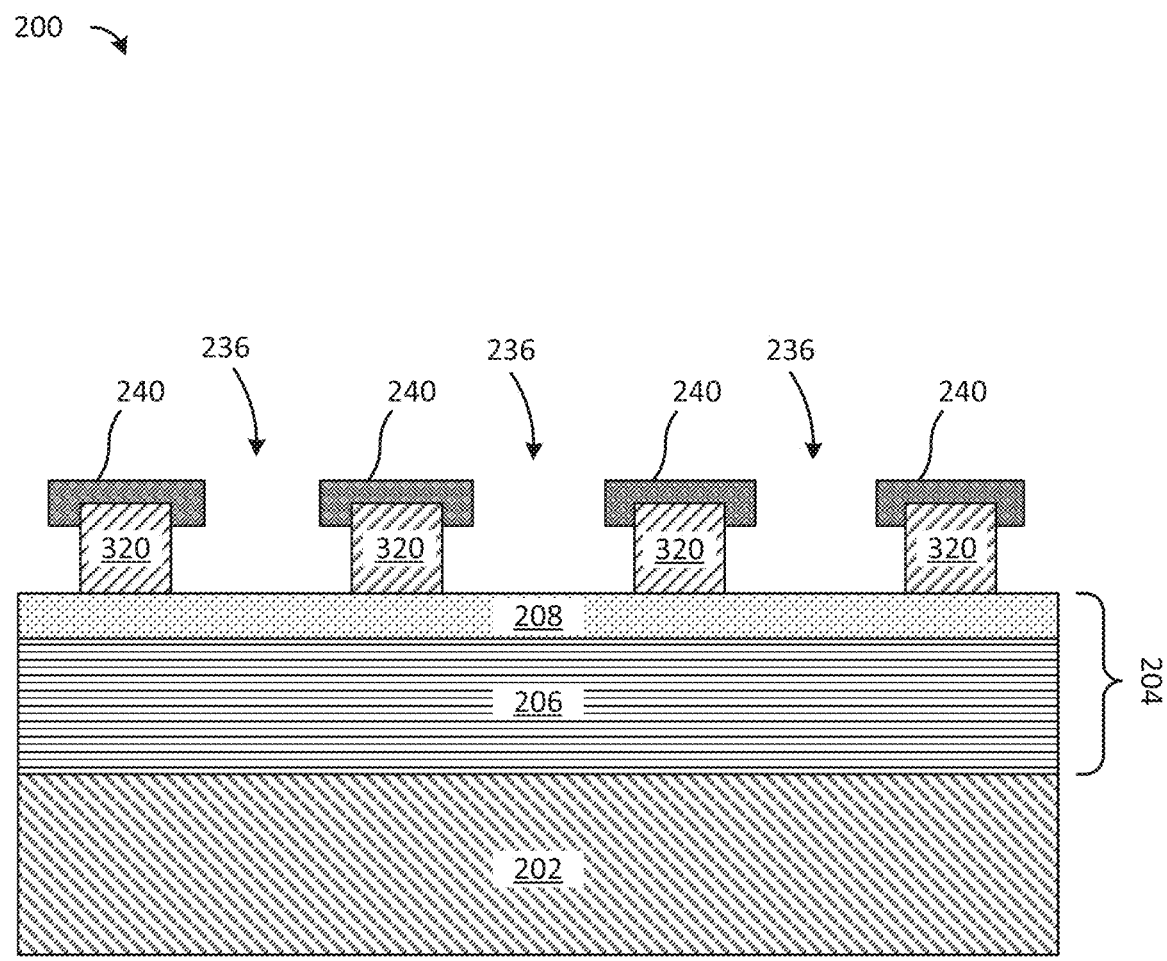

FIG. 7C illustrates an embodiment in which the first masking layer 232 has been consumed by the etch process and the dimensions of the patterned underlying layer 320 have been reduced by the etch process. An additional polarized light bombardment and ASD process may be performed to preferentially form additional portions of the second masking layer 240 over the patterned underlying layer 320. This may regenerate the mask on a partially etched structure (e.g., the semiconductor structure 200) by preferentially depositing on, e.g., top surfaces and/or upper sidewall portions of lines (such as the lines of the patterned underlying layer 320). In other words, partially through an etch process to pattern the target layer 204, the semiconductor structure 200 is bombarded with linearly polarized light again and another ASD process of the second masking layer 240 is performed.

Figure 8A:
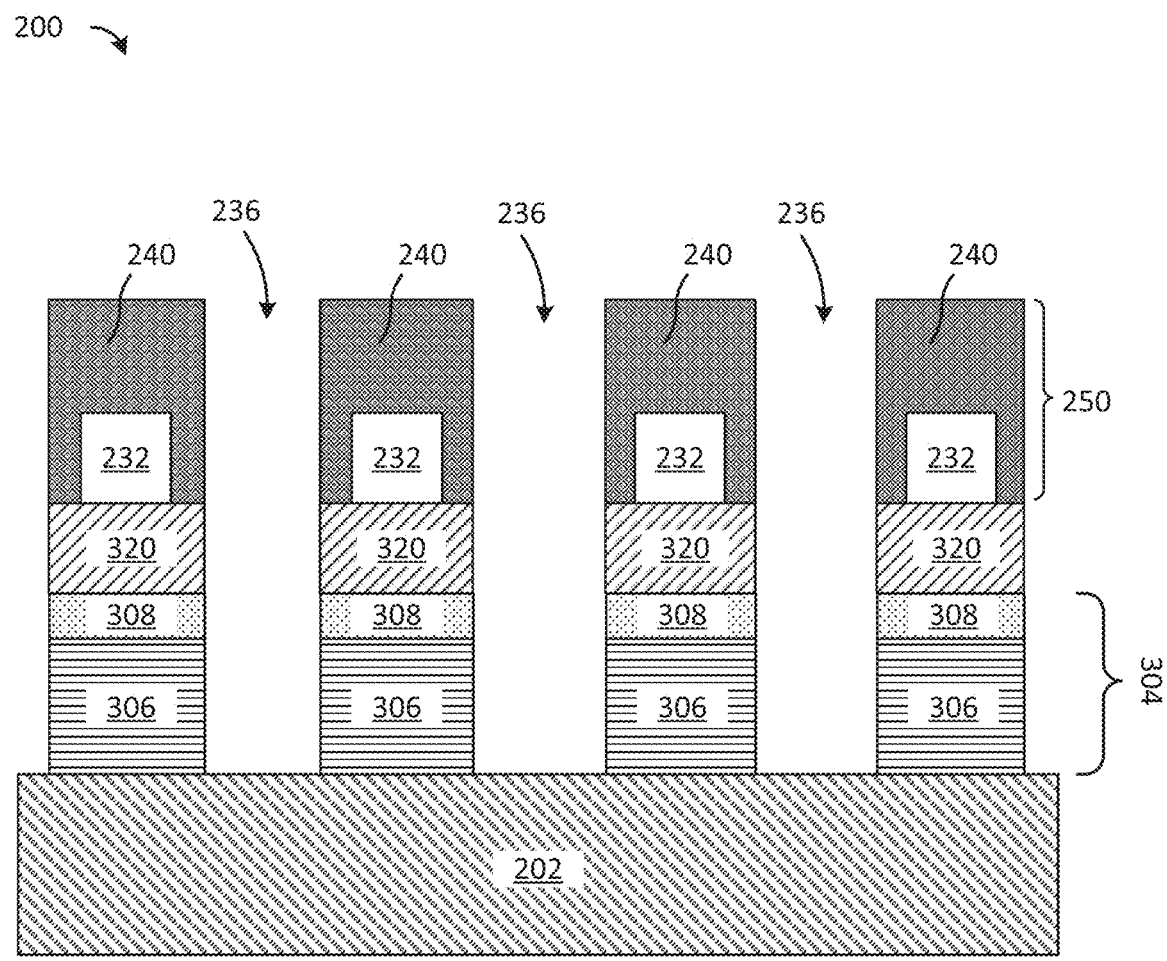
Figure 8B:
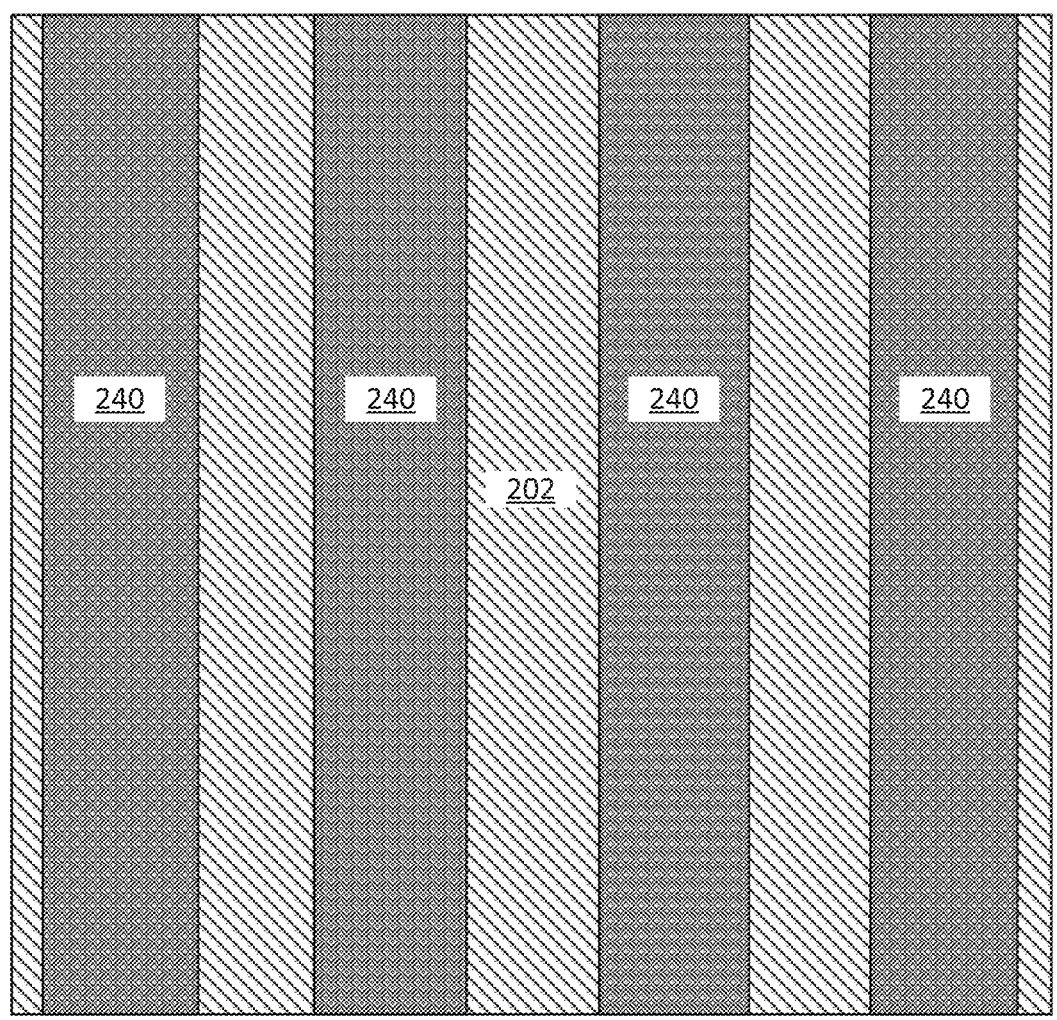

Next, in FIGS. 8A and 8B, the target layer 204 is patterned in order to subsequently form a pattern (e.g., a metallization pattern; see below, FIGS. 10A-10B). The etch mask 250 (if still present) and the patterned underlying layer 320 are used as an etching mask in an etching process (e.g., a wet or dry process) to extend the trenches 236 through the target layer 204. After the etching process, a patterned target layer 304 remains under the etch mask 250 (if present) and the patterned underlying layer 320. In some embodiments, the patterned target layer 304 comprises a patterned dielectric layer 306 and a patterned hardmask layer 308 on the patterned dielectric layer 306.

Figure 9A:
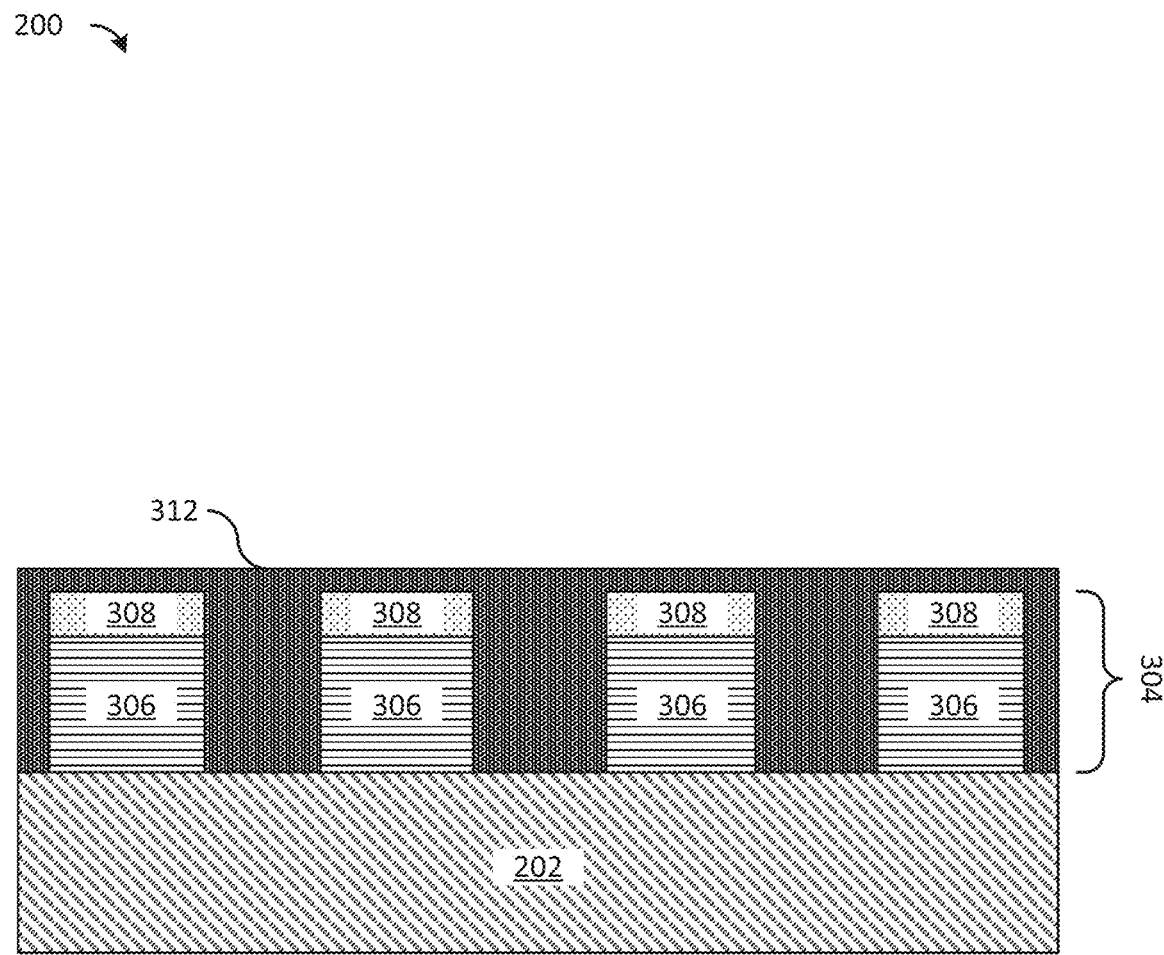
Figure 9B:
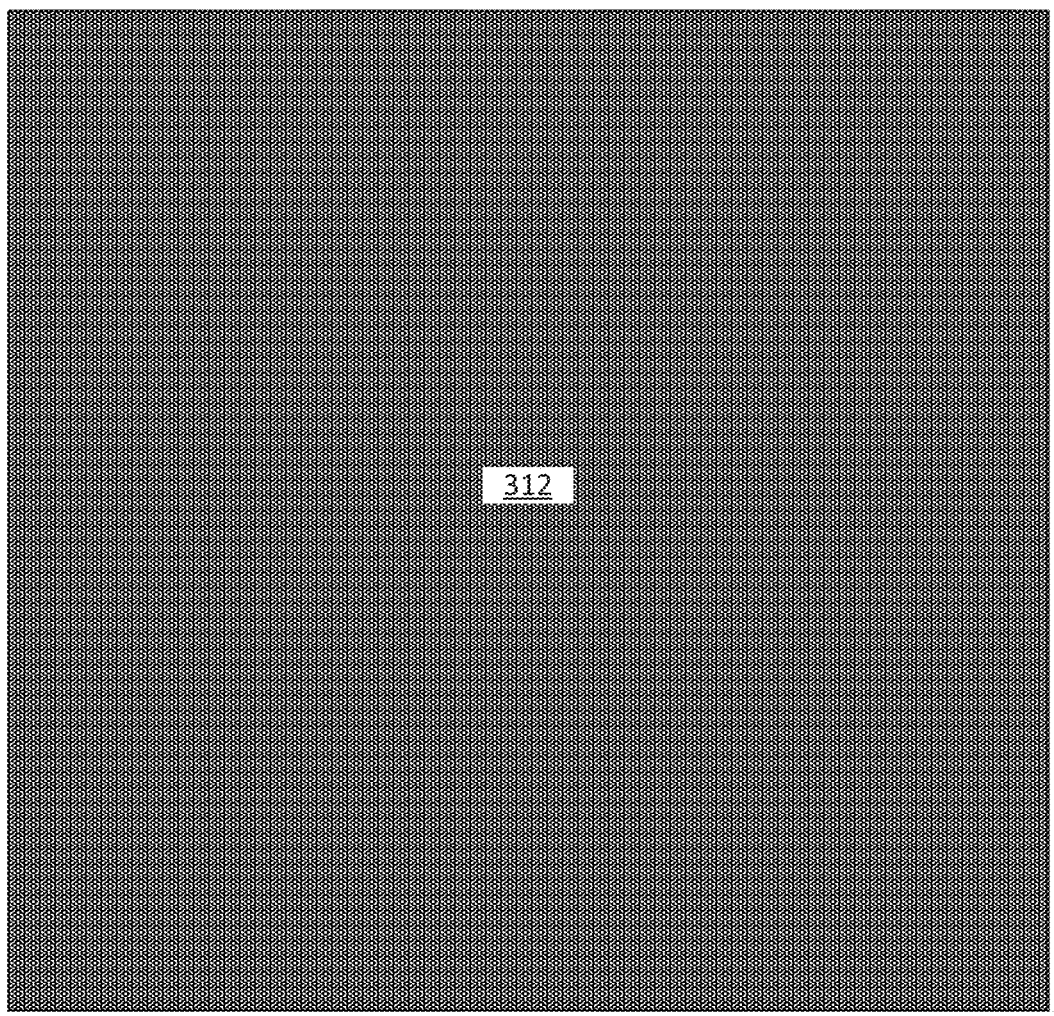

In FIGS. 9A and 9B, a material 312 is formed over the semiconductor structure 200 to fill the trenches 236 between portions of the patterned target layer 304. In some embodiments, the material 312 is a conductive material used to form a metallization pattern. However, the material 312 may comprise any suitable material, such as a dielectric material, a conductive material, or a combination thereof, and may be used to form any suitable feature, such as another mask for subsequent patterning processes. In some embodiments, prior to forming the material 312, the etch mask 250 (if present) and the patterned underlying layer 320 may be removed with a suitable process, e.g. a CMP. In embodiments where the material 312 is conductive, the material 312 may be copper formed using electroplating. However, any suitable conductive material (e.g., tungsten, cobalt, ruthenium, the like, or a combination thereof) and deposition method (e.g., ALD, PVD, or the like) may be used.

Figure 10A:
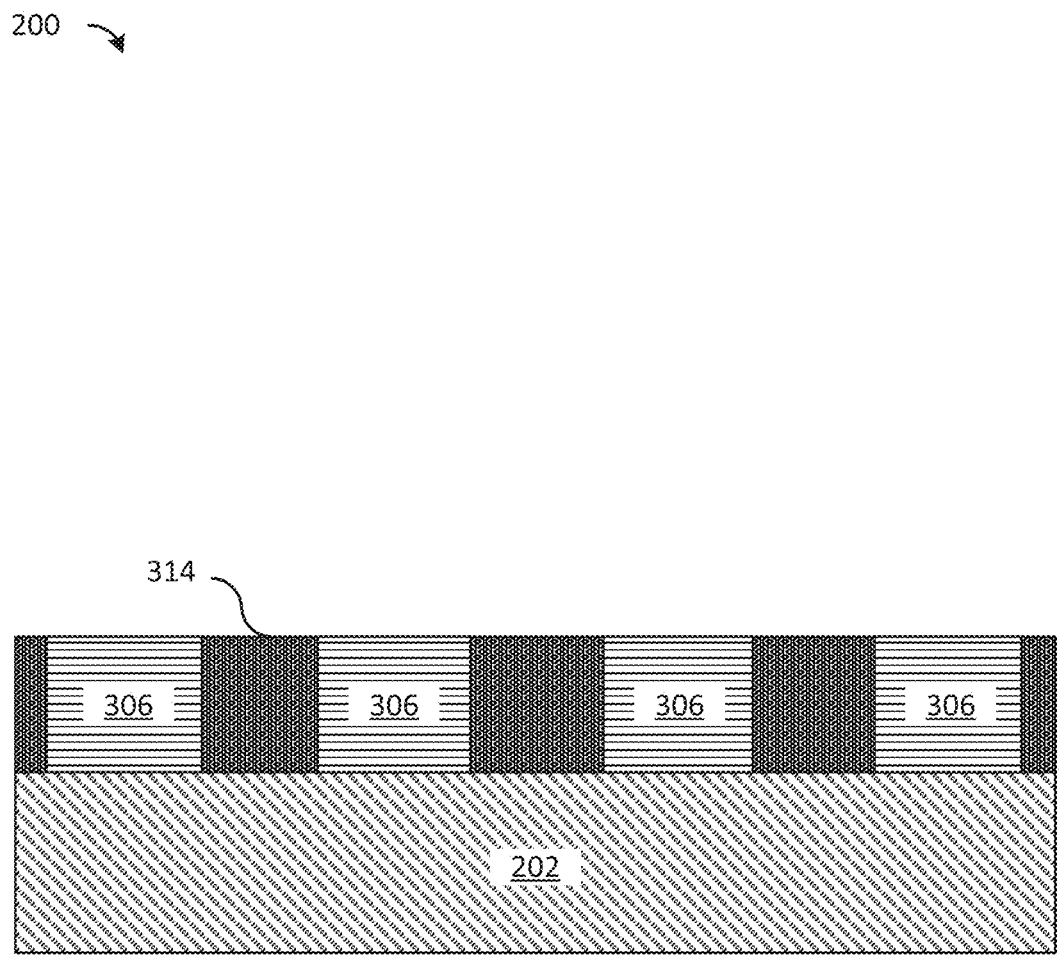
Figure 10B:
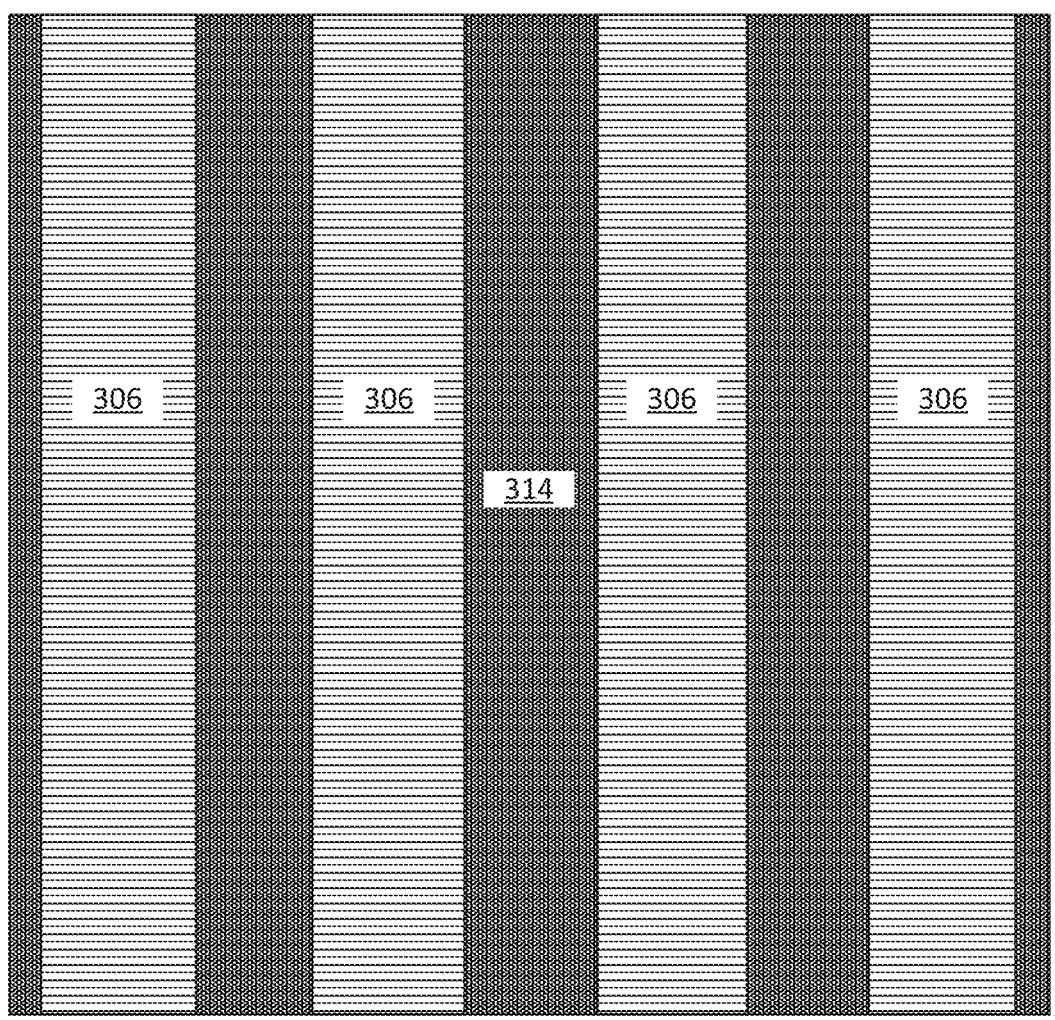

In FIGS. 10A and 10B, excess material 312 formed over a top surface of the patterned target layer 304 is removed with a suitable process, e.g. a CMP, to form a pattern 314. In embodiments where the material 312 is a conductive material, the pattern 314 may be, for example, a metallization pattern. However, the pattern 314 may also be a mask for subsequent patterning processes. In some embodiments, the patterned hardmask layer 308 is also removed, leaving the pattern 314 between remaining portions of the patterned dielectric layer 306. The shape of the pattern 314 may be improved by controlling the ASD process with a polarized light bombardment in order to preferentially deposit more of the second masking layer 240 on top surfaces of the first masking layer 232 in earlier patterning steps (see above, FIGS. 5 and 6A-6B).

Figure 11:
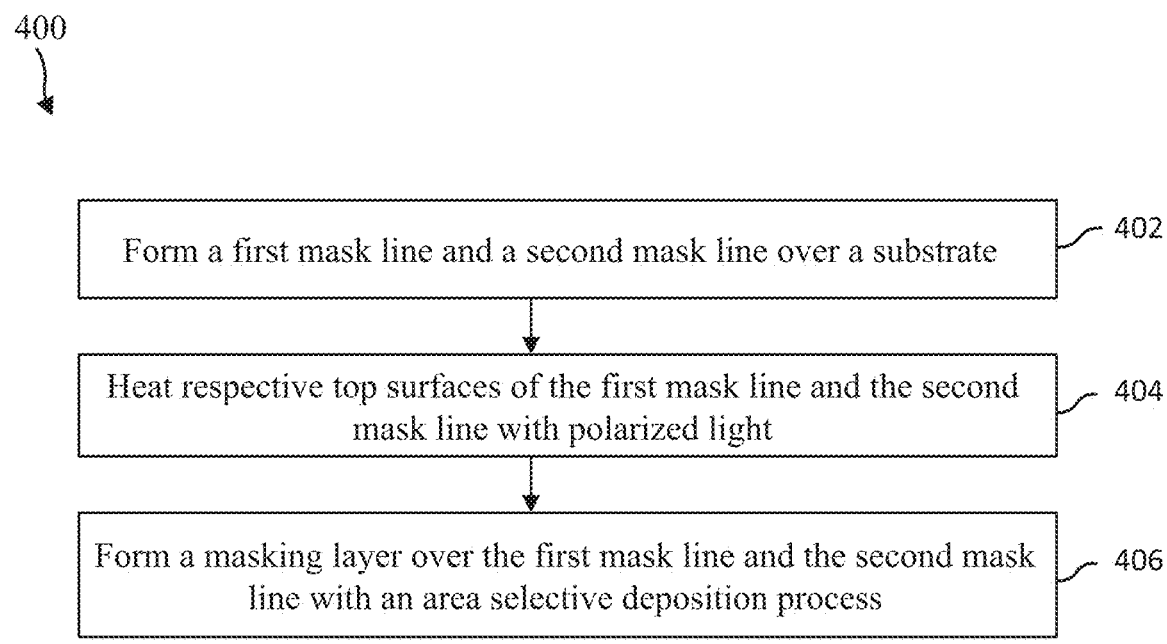
FIG. 11 illustrates a process flow chart diagram of a method for performing an area selective deposition, in accordance with some embodiments.

FIG. 11 illustrates a process flow chart diagram of a method 400 for an area selective deposition process, in accordance with some embodiments. In step 402, a first masking layer 232 comprising a first mask line and a second mask line is formed over a substrate 202, as described above with respect to FIGS. 3, 4A, and 4B. A trench 236 between the first mask line and the second mask line has a first width W1.

In step 404, respective top surfaces of the first mask line and the second mask line are heated with polarized light 130 in a plasma processing chamber 106, as described above with respect to FIGS. 1A and 5. The first width W1 is smaller than half a wavelength of the polarized light 130.

In step 406, a second masking layer 240 is formed over the first masking layer 232 with an area selective deposition process, as described above with respect to FIGS. 6A-6B. The second masking layer is thinner over a sidewall of the first mask line than over a top surface of the first mask line.

Figure 12:
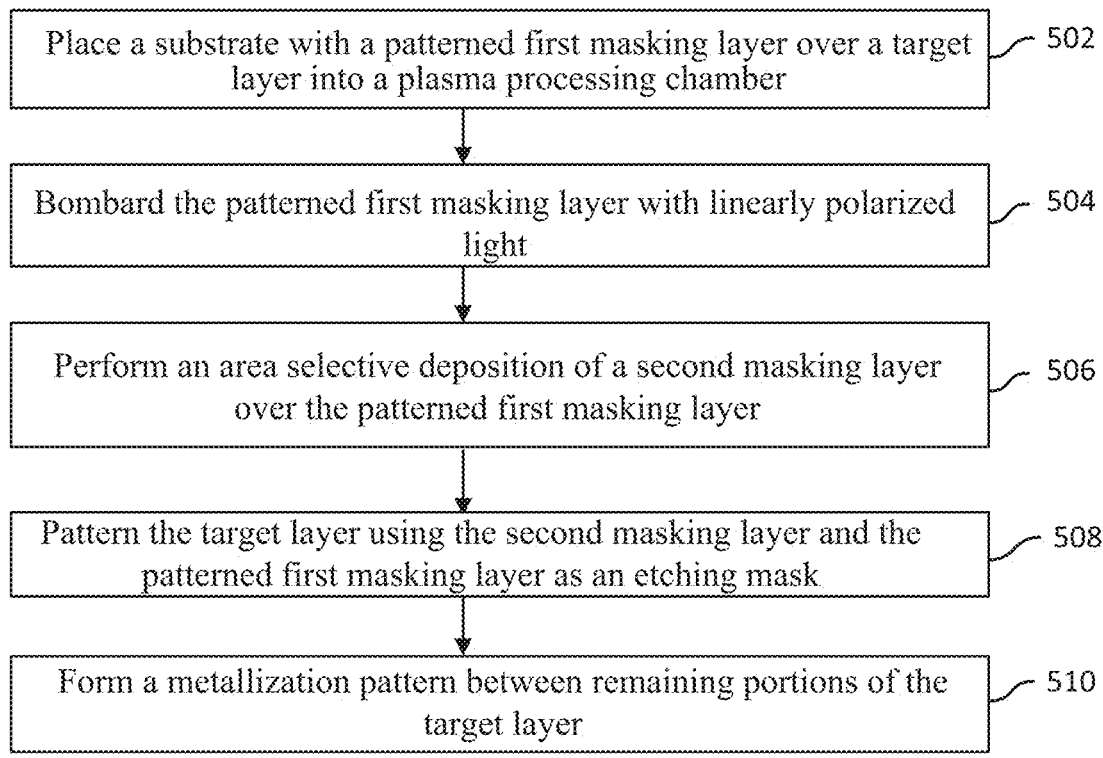
FIG. 12 illustrates a process flow chart diagram of a method for manufacturing a semiconductor structure, in accordance with some embodiments.

FIG. 12 illustrates a process flow chart diagram of a method 500 for manufacturing a semiconductor structure, in accordance with some embodiments. In step 502, a substrate 110 is placed into a plasma processing chamber 106, as described above with respect to FIGS. 1A and 5. A patterned first masking layer 232 is over a target layer 204 of the substrate 110, as described above with respect to FIGS. 3, 4A, and 4B.

In step 504, the patterned first masking layer 232 is bombarded with linearly polarized light (e.g., polarized light 130), as described above with respect to FIGS. 1A and 5. A polarization direction of the linearly polarized light is aligned with a pattern of trenches 236 through the patterned first masking layer 232.

In step 506, an area selective deposition of a second masking layer 240 over the patterned first masking layer 232 is performed, as described above with respect to FIGS. 6A-6B. In step 508, the target layer 204 is patterned using the second masking layer 240 and the patterned first masking layer 232 as an etching mask, as described above with respect to FIGS. 7A-8B. In step 510, a pattern 314 is formed between remaining portions of the target layer 204 (e.g., the patterned dielectric layer 306), as described above with respect to FIGS. 9A-10B.

Example embodiments of the invention are described below. Other embodiments can also be understood from the entirety of the specification as well as the claims filed herein.

Example 1. A method for an area selective deposition process, the method including: forming a first masking layer over a substrate, the first masking layer including a first mask line and a second mask line, where a trench between the first mask line and the second mask line has a first width; in a plasma processing chamber, heating respective top surfaces of the first mask line and the second mask line with polarized light, where the first width is smaller than half a wavelength of the polarized light; and in the plasma processing chamber, forming a second masking layer over the first masking layer with an area selective deposition process, where the second masking layer is thinner over a sidewall of the first mask line than over a top surface of the first mask line.

Example 2. The method of example 1, where the polarized light is linearly polarized.

Example 3. The method of example 1, where the polarized light is circularly polarized.

Example 4. The method of one of examples 1 to 3, where the polarized light enters the plasma processing chamber through a top surface of the plasma processing chamber.

Example 5. The method of one of examples 1 to 3, where the polarized light enters the plasma processing chamber through a sidewall of the plasma processing chamber.

Example 6. The method of one of examples 1 to 5, where the polarized light is projected into the plasma processing chamber by a digital light projection system.

Example 7. The method of one of examples 1 to 6, where a temperature of the respective top surfaces of the first mask line and the second mask line is higher than a temperature of a bottom surface of the trench after heating the respective top surfaces of the first mask line and the second mask line with polarized light.

Example 8. A method for manufacturing a semiconductor structure, the method including: placing a substrate into a plasma processing chamber, a patterned first masking layer being over a target layer of the substrate; bombarding the patterned first masking layer with linearly polarized light, where a polarization direction of the linearly polarized light is aligned with a pattern of trenches through the patterned first masking layer; performing a first area selective deposition of a second masking layer over the patterned first masking layer; patterning the target layer using the second masking layer and the patterned first masking layer as an etching mask; and forming a pattern between remaining portions of the target layer.

Example 9. The method of example 8, further including, partially through an etch process to pattern the target layer, bombarding the substrate with linearly polarized light and performing a second area selective deposition of the second masking layer.

Example 10. The method of one of examples 8 or 9, where the first area selective deposition forms a greater proportion of material over top surfaces of the patterned first masking layer than over sidewalls of the patterned first masking layer.

Example 11. The method of one of examples 8 to 10, where the plasma processing chamber is part of an inductively coupled plasma processing system.

Example 12. The method of one of examples 8 to 10, where the plasma processing chamber is part of a capacitively coupled plasma processing system.

Example 13. The method of one of examples 8 to 12, where the linearly polarized light is produced by a pulsed laser generator.

Example 14. A plasma processing system including: a plasma processing chamber; a chuck configured to hold a substrate; and an ellipsometer, the ellipsometer configured to provide polarized light to the substrate in the plasma processing chamber, the ellipsometer including a laser generator, a polarizing filter between the laser generator and the plasma processing chamber, a detector, and an analyzer between the detector and the plasma processing chamber.

Example 15. The plasma processing system of example 14, where the ellipsometer is configured to provide polarized light through a top surface of the plasma processing chamber.

Example 16. The plasma processing system of example 14, where the ellipsometer is configured to provide polarized light through a sidewall of the plasma processing chamber.

Example 17. The plasma processing system of one of examples 14 to 16, where the plasma processing chamber includes an antenna over the chuck, the antenna configured to inductively couple power to a plasma.

Example 18. The plasma processing system of one of examples 14 to 17, where the plasma processing chamber includes a first electrode over the chuck and a second electrode under the chuck, the first electrode and the second electrode being configured to capacitively couple power to a plasma.

Example 19. The plasma processing system of one of examples 14 to 18, where the laser generator is configured to produce laser pulses.

Example 20. The plasma processing system of one of examples 14 to 19, where the polarizing filter is a linear filter.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for an area selective deposition process, the method comprising:
   forming a first masking layer over a substrate, the first masking layer comprising a first mask line and a second mask line, wherein a trench between the first mask line and the second mask line has a first width;
   in a plasma processing chamber, heating respective top surfaces of the first mask line and the second mask line with polarized light, wherein the first width is smaller than half a wavelength of the polarized light; and
   in the plasma processing chamber, forming a second masking layer over the first masking layer with an area selective deposition process, wherein the second masking layer is thinner over a sidewall of the first mask line than over a top surface of the first mask line.

2. The method of claim 1, wherein the polarized light is linearly polarized.

3. The method of claim 1, wherein the polarized light is circularly polarized.

4. The method of claim 1, wherein the polarized light enters the plasma processing chamber through a top surface of the plasma processing chamber.

5. The method of claim 1, wherein the polarized light enters the plasma processing chamber through a sidewall of the plasma processing chamber.

6. The method of claim 1, wherein the polarized light is projected into the plasma processing chamber by a digital light projection system.

7. The method of claim 1, wherein a temperature of the respective top surfaces of the first mask line and the second mask line is higher than a temperature of a bottom surface of the trench after heating the respective top surfaces of the first mask line and the second mask line with polarized light.

8. A method for manufacturing a semiconductor structure, the method comprising:
   placing a substrate into a plasma processing chamber, a patterned first masking layer being over a target layer of the substrate;
   bombarding the patterned first masking layer with linearly polarized light, wherein a polarization direction of the linearly polarized light is aligned with a pattern of trenches through the patterned first masking layer;
   performing a first area selective deposition of a second masking layer over the patterned first masking layer;
   patterning the target layer using the second masking layer and the patterned first masking layer as an etching mask; and
   forming a pattern between remaining portions of the target layer.

9. The method of claim 8, further comprising, partially through an etch process to pattern the target layer, bombarding the substrate with linearly polarized light and performing a second area selective deposition of the second masking layer.

10. The method of claim 8, wherein the first area selective deposition forms a greater proportion of material over top surfaces of the patterned first masking layer than over sidewalls of the patterned first masking layer.

11. The method of claim 8, wherein the plasma processing chamber is part of an inductively coupled plasma processing system.

12. The method of claim 8, wherein the plasma processing chamber is part of a capacitively coupled plasma processing system.

13. The method of claim 8, wherein the linearly polarized light is produced by a pulsed laser generator.

14. A method for manufacturing a semiconductor structure, the method comprising:
forming a first masking layer over a target layer, the target layer being over a substrate, the first masking layer comprising a first mask line and a second mask line, wherein a trench between the first mask line and the second mask line has a first width;
placing the substrate into a plasma processing chamber;
heating respective top surfaces of the first mask line and the second mask line with polarized light, the first width being smaller than half a wavelength of the polarized light;
performing a first area selective deposition of a second masking layer over the first masking layer;
patterning the target layer using the second masking layer and the first masking layer as an etching mask; and
forming a pattern between remaining portions of the target layer.

15. The method of claim 14, wherein the polarized light is linearly polarized.

16. The method of claim 15, wherein a polarization direction of the polarized light is aligned with the trench.

17. The method of claim 14, wherein the polarized light is circularly polarized.

18. The method of claim 14, wherein the second masking layer is thinner over a sidewall of the first mask line than over a top surface of the first mask line.

19. The method of claim 14, wherein the polarized light enters the plasma processing chamber through a top surface of the plasma processing chamber.

20. The method of claim 14, wherein the polarized light enters the plasma processing chamber through a sidewall of the plasma processing chamber.

\* \* \* \* \*